(12) United States Patent
Jagannathan et al.

(10) Patent No.: US 8,835,232 B2
(45) Date of Patent: Sep. 16, 2014

(54) LOW EXTERNAL RESISTANCE ETSOI TRANSISTORS

(75) Inventors: Hemanth Jagannathan, Guilderland, NY (US); Sivananda K. Kanakasabapathy, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,694

(22) Filed: Sep. 7, 2012

(65) Prior Publication Data

US 2013/0217190 A1 Aug. 22, 2013

Related U.S. Application Data

(63) Continuation of application No. 13/399,040, filed on Feb. 17, 2012.

(51) Int. Cl.
*H01L 29/78* (2006.01)
(52) U.S. Cl.
USPC .................................. 438/151; 257/E21.423
(58) Field of Classification Search
CPC ............ H01L 29/78; H01L 21/823814; H01L 21/823807
USPC ................... 438/301; 257/E21.433
See application file for complete search history.

(56) References Cited

U.S. PATENT DOCUMENTS

| 5,629,544 | A | * | 5/1997 | Voldman et al. | 257/355 |
|---|---|---|---|---|---|
| 7,060,576 | B2 | | 6/2006 | Lindert et al. | |
| 7,075,150 | B2 | | 7/2006 | Boyd et al. | |
| 7,081,891 | B2 | | 7/2006 | Schermerhorn | |
| 2002/0063299 | A1 | | 5/2002 | Kamata et al. | |
| 2005/0176204 | A1 | * | 8/2005 | Langdo et al. | 438/298 |
| 2006/0091490 | A1 | | 5/2006 | Chen et al. | |
| 2009/0124057 | A1 | * | 5/2009 | Guha et al. | 438/301 |
| 2009/0230479 | A1 | | 9/2009 | Hsu et al. | |
| 2010/0129971 | A1 | * | 5/2010 | Ohta et al. | 438/230 |
| 2010/0164020 | A1 | * | 7/2010 | Kronholz et al. | 257/408 |
| 2010/0224938 | A1 | * | 9/2010 | Zhu | 257/369 |
| 2011/0024840 | A1 | * | 2/2011 | Khater | 257/347 |

(Continued)

OTHER PUBLICATIONS

Cheng, K. et al., "Fully Depleted Extremely Thin SOI Technology Fabricated by a Novel Integration Scheme Featuring Implant-Free, Zero-Silicon-Loss, and Faceted Raised Source/Drain" 2009 Symposium on VLSI Technology (Jun. 16-18, 2009) pp. 212-213.

(Continued)

*Primary Examiner* — Kevin Parendo
*Assistant Examiner* — Lamont Koo
(74) *Attorney, Agent, or Firm* — Scully, Scott, Murphy & Presser, P.C.; Daniel P. Morris

(57) ABSTRACT

A disposable dielectric structure is formed on a semiconductor-on-insulator (SOI) substrate such that all physically exposed surfaces of the disposable dielectric structure are dielectric surfaces. A semiconductor material is selectively deposited on semiconductor surfaces, while deposition of any semiconductor material on dielectric surfaces is suppressed. After formation of at least one gate spacer and source and drain regions, a planarization dielectric layer is deposited and planarized to physically expose a top surface of the disposable dielectric structure. The disposable dielectric structure is replaced with a replacement gate stack including a gate dielectric and a gate conductor portion. Lower external resistance can be provided without impacting the short channel performance of a field effect transistor device.

17 Claims, 17 Drawing Sheets

(56) References Cited

U.S. PATENT DOCUMENTS

| 2011/0042744 | A1 | 2/2011 | Cheng et al. | |
|---|---|---|---|---|
| 2011/0049630 | A1 | 3/2011 | Majumdar et al. | |
| 2011/0227157 | A1 | 9/2011 | Yang et al. | |
| 2011/0233688 | A1* | 9/2011 | Ren et al. | 257/408 |

OTHER PUBLICATIONS

Cheng, K. et al., "Extremely Thin SOI (ETSOI) CMOS with Record Low Variability for Low Power System-on-Chip Applications" 2009 IEEE International Electron Devices Meeting (IEDM) (Dec. 7-9, 2009) pp. 49-52.

Khakifirooz, A. et al., "MOSFET Performance Scaling—Part II: Future Directions" IEEE Transactions on Electron Devices (Jun. 2008) pp. 1401-1408, vol. 55, No. 6.

Khakifirooz, A. et al., "Fully Depleted Extremely Thin SOI for Mainstream 20nm Low-Power Technology and Beyond" 2010 IEEE International Solid-State Circuits Conference Digest of Technical Papers (ISSCC) (Feb. 7-11, 2010) pp. 152-153.

Office Action dated Feb. 8, 2013 received in a related U.S. Appl. No. 13/399,040.

Office Action dated Sep. 24, 2013 received in a related U.S. Patent Application, namely U.S. Appl. No. 13/399,040.

Office Action dated Mar. 28, 2014 received in a related U.S. Patent Application, namely U.S. Appl. No. 13/399,040.

* cited by examiner

LOW EXTERNAL RESISTANCE ETSOI TRANSISTORS

CROSS REFERENCE TO RELATED APPLICATION

This application is a continuation of U.S. patent application Ser. No. 13/399,040, filed Feb. 17, 2012 the entire content and disclosure of which is incorporated herein by reference.

BACKGROUND

The present disclosure relates to semiconductor structures, and particularly to extremely thin semiconductor-on-insulator (ETSOI) field effect transistors having low external resistance, and methods of manufacturing the same.

Extremely thin semiconductor-on-insulator (ETSOI) devices have been proposed to enable continued scaling of complementary metal-oxide-semiconductor (CMOS) devices with superior short channel characteristics at sub-20 nm gate lengths so that enhanced gate control can be provided to a thin semiconductor channel having a thickness not greater than 30 nm. However, high external resistance, i.e., high source/drain resistance, adversely impacts the performance of ETSOI field effect transistor by limiting the on-current. This problem is caused by the limited thickness of a top semiconductor layer, as well as by dopant leaching from the extension regions into a buried oxide layer. In order to enhance the performance of ETSOI field effect transistors, the external resistance of the source and drain regions of the ETSOI field effect transistors need to be minimized.

SUMMARY

A disposable dielectric structure is formed on a semiconductor-on-insulator (SOI) substrate such that all physically exposed surfaces of the disposable dielectric structure are dielectric surfaces. A semiconductor material is selectively deposited on semiconductor surfaces, while deposition of any semiconductor material on dielectric surfaces is suppressed. After formation of at least one gate spacer and source and drain regions, a planarization dielectric layer is deposited and planarized to physically expose a top surface of the disposable dielectric structure. The disposable dielectric structure is replaced with a replacement gate stack including a gate dielectric and a gate conductor portion. Lower external resistance can be provided without impacting the short channel performance of a field effect transistor device.

According to an aspect of the present disclosure, a semiconductor structure is provided, which includes: a semiconductor-on-insulator (SOI) substrate including a handle substrate, a buried insulator layer, and a top semiconductor layer; a U-shaped gate dielectric having a bottommost surface that is in contact with a first portion of a topmost surface of the top semiconductor layer; a raised source region in contact with a second portion of the topmost surface of the top semiconductor layer and a lower portion of a first outer sidewall of the U-shaped gate dielectric; a raised drain region in contact with a third portion of the topmost surface of the top semiconductor layer and a lower portion of a second outer sidewall of the U-shaped gate dielectric; and a dielectric gate spacer laterally contacting upper portions of the first and second outer sidewalls of the U-shaped gate dielectric.

According to another aspect of the present disclosure, a method of forming a semiconductor structure is provided. The method includes: forming a disposable dielectric structure on a semiconductor-on-insulator (SOI) substrate, wherein all physically exposed surfaces of the disposable dielectric structure are dielectric surfaces; forming a raised source region and a raised drain region by selective deposition of a semiconductor material on a semiconductor surface of a top semiconductor layer of the SOI substrate; forming a dielectric gate spacer around the disposable dielectric structure over portions of the raised source region and raised drain region; forming a planarization dielectric layer over the dielectric gate spacer; physically exposing a top surface of the disposable dielectric structure by planarizing the planarization dielectric layer; and replacing materials of the disposable dielectric structure with a gate dielectric and a gate conductor portion.

DETAILED DESCRIPTION

Figure 1:
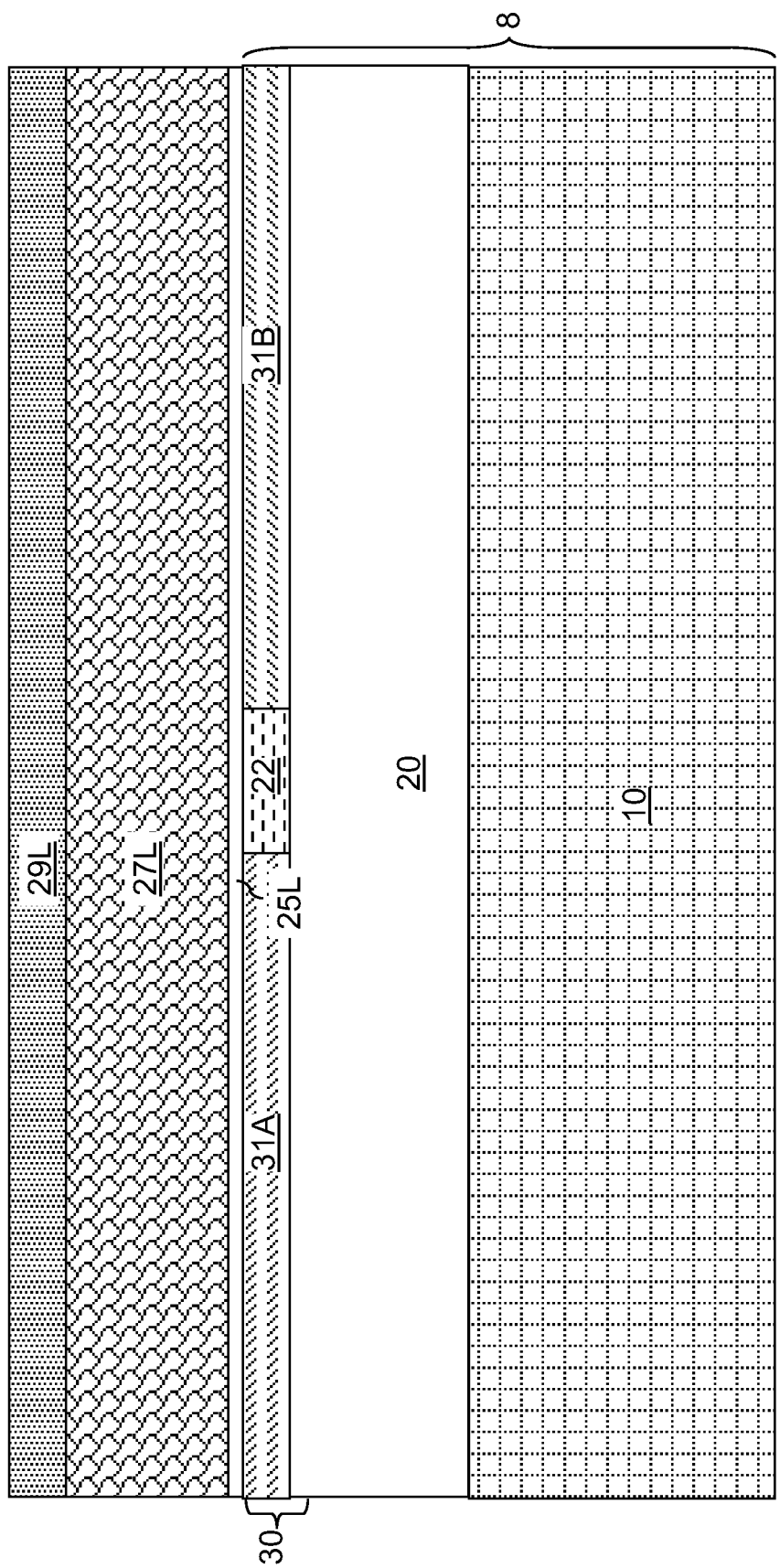
FIG. 1 is vertical cross-sectional view of a first exemplary semiconductor structure after formation of a shallow trench isolation structure (or a mesa isolation structure) and disposable dielectric material layers on a semiconductor-on-insulator (SOI) substrate according to a first embodiment of the present disclosure.

As stated above, the present disclosure relates to extremely thin semiconductor-on-insulator (ETSOI) field effect transistors having low external resistance, and methods of manufacturing the same, which are now described in detail with accompanying figures. Like and corresponding elements mentioned herein and illustrated in the drawings are referred to by like reference numerals. The drawings are not necessarily drawn to scale.

Referring to FIG. 1, an exemplary semiconductor structure according to an embodiment of the present disclosure includes a semiconductor substrate 8. The semiconductor substrate 8 can be a semiconductor-on-insulator (SOI) substrate that includes a handle substrate 10, a buried insulator layer 20, and a top semiconductor layer 30. The handle substrate 10 provides mechanical support for the buried insulator layer 20 and the top semiconductor layer 30. The thickness of the handle substrate 10 can be, for example, from 50 microns to 2 mm, although lesser and greater thicknesses can also be employed. The buried insulator layer 20 includes a dielectric material such as silicon oxide, silicon nitride, silicon oxynitride, or a combination thereof. The thickness of the buried insulator layer 20 can be from 10 nm to 1,000 nm, although lesser and greater thicknesses can also be employed. The top semiconductor layer 30 includes a semiconductor material, which can be any semiconductor material known in the art. In one embodiment, the top semiconductor layer 30 includes a single crystalline semiconductor material such as single crystalline silicon. The thickness of the top semiconductor layer 30 can be from 3 nm to 100 nm, although lesser and greater thicknesses can also be employed. In one embodiment, the semiconductor substrate 8 is an extremely thin semiconductor-on-insulator having a thickness from 3 nm to 15 nm. While the present disclosure is described employing an SOI substrate as an illustrative example, the methods of the present disclosure can also be employed on a bulk semiconductor substrate.

A shallow trench isolation structure 22 can be formed in the top semiconductor layer 30 by forming a shallow trench extending from the top surface of the top semiconductor layer 30 at least to the bottom surface of the top semiconductor layer 30, and subsequently filling the shallow trench with a dielectric material such as silicon oxide, silicon nitride, and/or silicon oxynitride. Excess dielectric material above the top surface of the top semiconductor layer 30 is removed, for example, by planarization such as chemical mechanical planarization (CMP). Alternatively a mesa isolation structure (not shown) can be formed in the top semiconductor layer 30 by removing the top semiconductor layer 30 at least to the bottom surface of the top semiconductor layer 30, and leaving the gap of the etched semiconductor material as is to function as an isolation region.

The shallow trench isolation structure 22, or the mesa isolation structure (not shown), can laterally surround, and electrically isolate, a first top semiconductor portion 31A and a second top semiconductor portion 31B, which are remaining portions of the semiconductor material within the top semiconductor layer 30 after formation of the shallow trench isolation structure 22 or the mesa isolation structure. Optionally, electrical dopants of p-type and/or n-type can be implanted into one or more of the first and second top semiconductor portions (31A, 31B) by masked ion implantation.

At least one disposable dielectric material layer is deposited on the semiconductor substrate 8. The at least one disposable dielectric material layer can include, for example, an optional disposable bottom dielectric material layer 25L, a disposable dielectric material layer 27L, and an optional disposable top dielectric material layer 29L. Each of the optional disposable bottom dielectric material layer 25L and the optional disposable top dielectric material layer 29L may, or may not, be present. Each of the optional disposable bottom dielectric material layer 25L, the disposable dielectric material layer 27L, and the optional disposable top dielectric material layer 29L includes a dielectric material, which can be silicon oxide, silicon nitride, silicon oxynitride, organosilicate glass, a dielectric metal oxide, or a combination thereof. Each of the optional disposable bottom dielectric material layer 25L, the disposable dielectric material layer 27L, and the optional disposable top dielectric material layer 29L can be deposited by, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. For example, the optional disposable bottom dielectric material layer 25L can include silicon oxide or silicon oxynitride, the disposable dielectric material layer 27L can include silicon oxide or organosilicate glass, and the optional disposable top dielectric material layer 29L can include silicon oxide or silicon nitride. The thickness of the optional disposable bottom dielectric material layer 25L can be from 0.5 nm to 10 nm, the thickness of the disposable dielectric material layer 27L can be from 30 nm to 300 nm, and the thickness of the optional disposable top dielectric material layer 29L can be from 1 nm to 20 nm, although lesser and greater thicknesses can also be employed for each of the optional disposable bottom dielectric material layer 25L, the disposable dielectric material layer 27L, and the optional disposable top dielectric material layer 29L.

Figure 2:
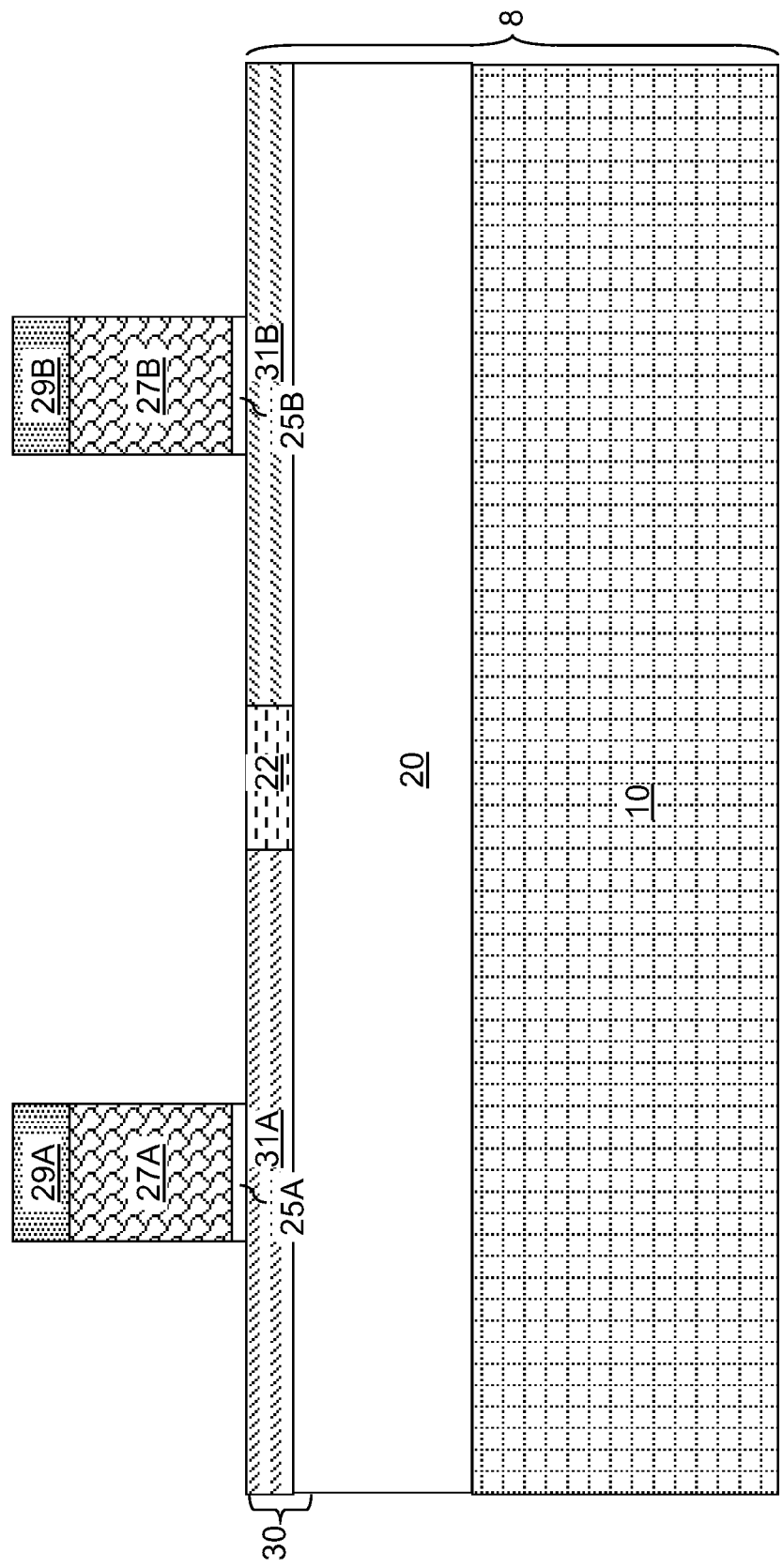
FIG. 2 is vertical cross-sectional view of the first exemplary semiconductor structure after formation of disposable dielectric structures according to the first embodiment of the present disclosure.

Referring to FIG. 2, the optional disposable bottom dielectric material layer 25L, the disposable dielectric material layer 27L, and the optional disposable top dielectric material layer 29L are patterned, for example, by applying and patterning a photoresist on the top surface of the first exemplary semiconductor structure, and transferring the pattern in the photoresist into the optional disposable bottom dielectric material layer 25L, the disposable dielectric material layer 27L, and the optional disposable top dielectric material layer 29L by an anisotropic etch that employs the patterned photoresist as an etch mask. At least one disposable dielectric structure is formed, each of which includes an optional disposable bottom dielectric material portion, a disposable dielectric material portion, and an optional disposable top dielectric material portion. For example, the at least one disposable dielectric structure can include a first disposable dielectric structure (25A, 27A, 29A) that includes an optional first disposable bottom dielectric material portion 25A, a first disposable dielectric material portion 27A, and an optional first disposable top dielectric material portion 29A, and a second disposable dielectric structure (25B, 27B, 29B) that includes an optional second disposable bottom dielectric material portion 25B, a second disposable dielectric material portion 27B, and an optional second disposable top dielectric material portion 29B.

All physically exposed surfaces of the first disposable dielectric structure (25A, 27A, 29A) and the second disposable dielectric structure (25B, 27B, 29B) are dielectric surfaces. Each of the disposable dielectric structures can consists of at least one dielectric material, and has vertical sidewalls that contiguously enclose that disposable dielectric laterally. Each disposable dielectric structure is in contact with a semiconductor surface of the top semiconductor layer 30 of the semiconductor substrate 8.

Figure 3:
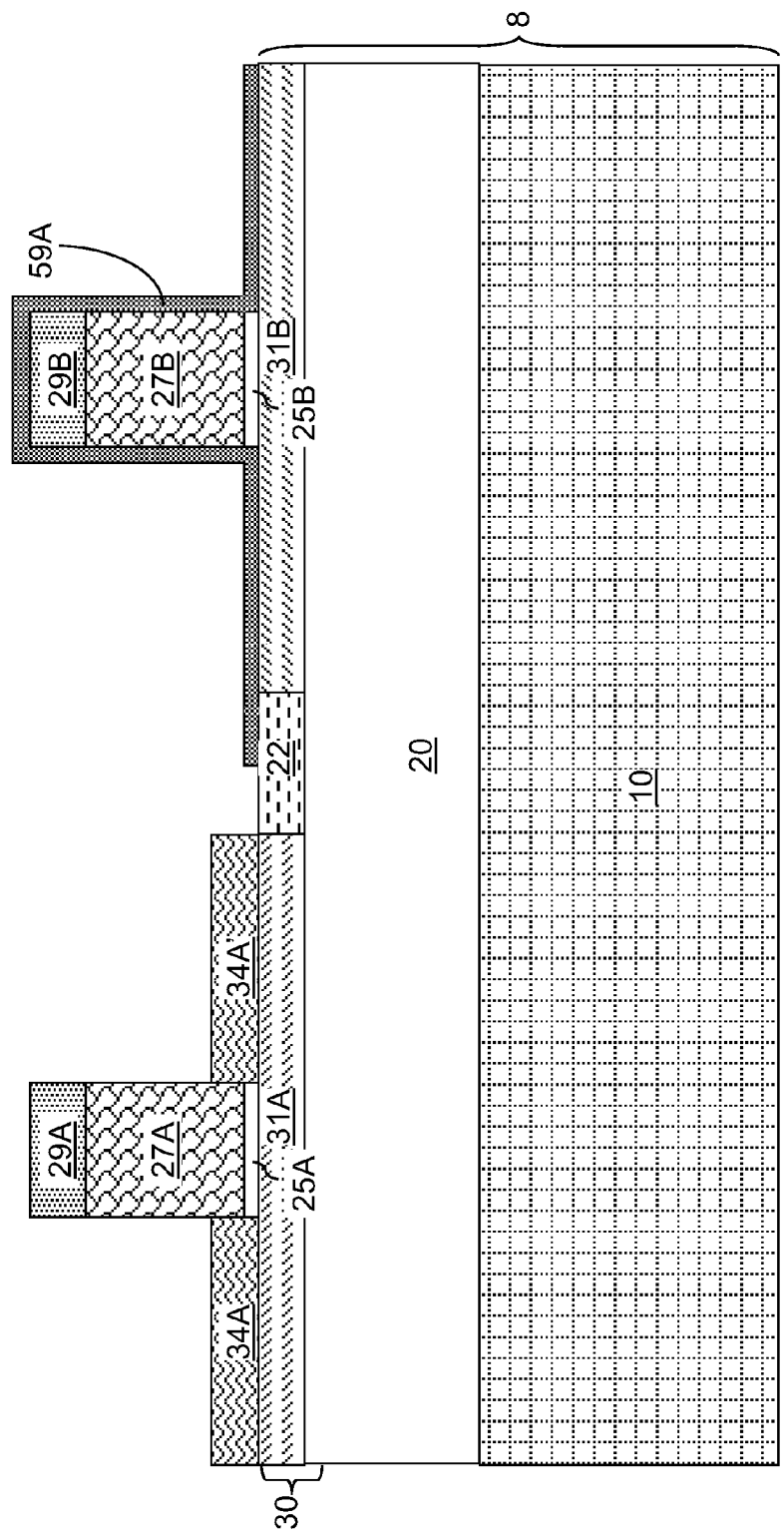
FIG. 3 is a vertical cross-sectional view of the first exemplary semiconductor structure after formation and patterning of a first dielectric mask layer and selective growth of raised source and drain regions according to the first embodiment of the present disclosure.

Referring to FIG. 3, a first dielectric mask layer 59A is deposited and lithographically patterned to cover the second disposable dielectric structure (25B, 27B, 29B) and the second top semiconductor portion 31B, while not covering the first disposable dielectric structure (25A, 27A, 29A) or the first top semiconductor portion 31A. The first dielectric mask layer 59A includes a dielectric material such as silicon nitride, silicon oxide, silicon oxynitride, or a combination thereof. The first dielectric mask layer 59A can be formed conformally, for example, by chemical vapor deposition (CVD). The thickness of the first dielectric mask layer 59A can be from 1 nm to 20 nm, although lesser and greater thicknesses can also be employed.

A semiconductor material is selectively deposited on the physically exposed portions of the semiconductor surface of the first top semiconductor portion 31A. The semiconductor material can be deposited, for example, by selective epitaxy.

First raised semiconductor material portions (34A, 34A') are formed on, and above, the top surface of the first top semiconductor portion 31A. In one embodiment, the first raised semiconductor material portions (34A, 34A') can be in-situ doped with electrical dopants, i.e., p-type dopants or n-type dopants. In one embodiment, the first top semiconductor portion 31A can include an intrinsic semiconductor material, and the first raised semiconductor material portions (34A, 34A') can include p-type dopants or n-type dopants. In one embodiment, the first top semiconductor portion 31A can include electrical dopants of a first conductivity type, and the first raised semiconductor material portions (34A, 34A') can include electrical dopants of a second conductivity type, which is the opposite of the first conductivity type. For example, the first conductivity type can be p-type and the second conductivity type can be n-type, or vice versa. If the first raised semiconductor material portions (34A, 34A') are formed with in-situ doping of electrical dopants, the first raised semiconductor material portions (34A, 34A') are raised source and drain regions, i.e., a raised source region and a raised drain region, which are located above a topmost surface of a channel of a field effect transistor to be subsequently formed.

The optional first disposable bottom dielectric material portion 25A or the first disposable dielectric material portion 27A is in contact with a first portion of the topmost surface of the first top semiconductor portion 31A. One of the first raised semiconductor material portions 34A is in contact with a second portion of the topmost surface of the first top semiconductor portion 31A. The other of the first raised semiconductor material portions 34A' is in contact with a third portion of the topmost surface of the first top semiconductor portion 31A.

In one embodiment, the thickness of first raised semiconductor material portions (34A, 34A') can be greater than the thickness of the top semiconductor layer 30. The thickness of the first raised semiconductor material portions (34A, 34A') can be less than the height of the first disposable dielectric structure (25A, 27A, 29A).

In one embodiment, the first top semiconductor portion 31A and the first raised semiconductor material portions (34A, 34A') can include a same semiconductor material.

In one embodiment, the first top semiconductor portion 31A can includes a first semiconductor material, the first raised semiconductor material portions (34A, 34A') can include a second semiconductor material that is different from the first semiconductor material. In a non-limiting illustrative example, the first semiconductor material can be silicon, and the second semiconductor material can be a silicon carbon alloy or a silicon germanium alloy.

In one embodiment, the first top semiconductor portion 31A and the first raised semiconductor material portions (34A, 34A') can include a same single crystalline semiconductor material that is formed by selective epitaxy.

In one embodiment, the first top semiconductor portion 31A can includes a first single crystalline semiconductor material, the first raised semiconductor material portions (34A, 34A') can include a second single crystalline semiconductor material that is different from the first single crystalline semiconductor material and formed by selective epitaxy. The second single crystalline semiconductor material can be epitaxially aligned to the first single crystalline semiconductor material of the first top semiconductor portion 31A. In a non-limiting illustrative example, the first semiconductor material can be single crystalline silicon, and the second semiconductor material can be a single crystalline silicon carbon alloy or a single crystalline silicon germanium alloy.

The first dielectric mask layer 59A is subsequently removed, for example, by an isotropic etch such as a wet etch.

Figure 4:
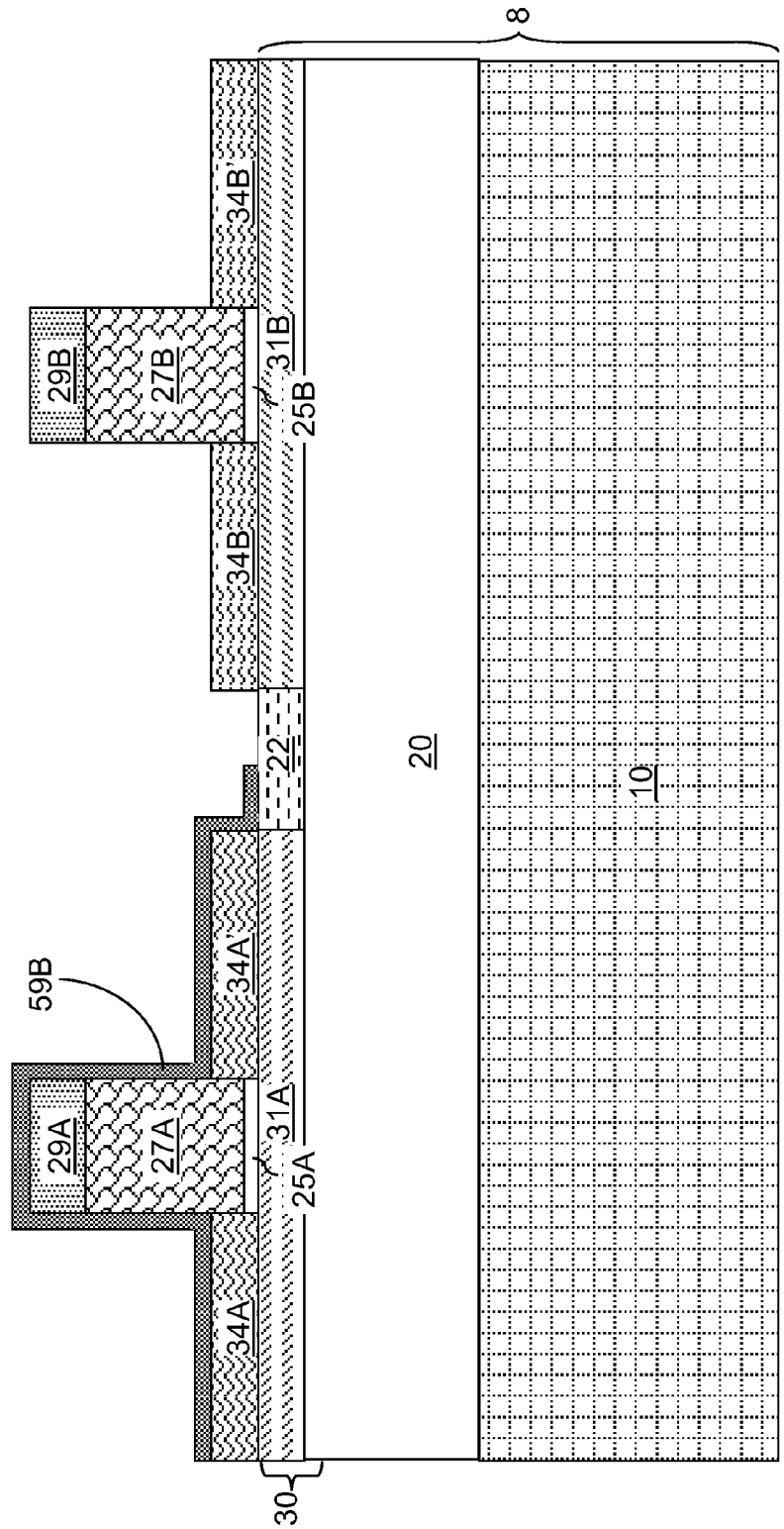
FIG. 4 is a vertical cross-sectional view of the first exemplary semiconductor structure after formation and patterning of a second dielectric mask layer and selective growth of second raised extension regions according to the first embodiment of the present disclosure.

Referring to FIG. 4, a second dielectric mask layer 59B is deposited and lithographically patterned to cover the first disposable dielectric structure (25A, 27A, 29A), the first top semiconductor portions (34A, 34A'), and the first top semiconductor portion 31A, while not covering the second disposable dielectric structure (25B, 27B, 29B) or the second top semiconductor portion 31B. The second dielectric mask layer 59B includes a dielectric material such as silicon nitride, silicon oxide, silicon oxynitride, or a combination thereof. The second dielectric mask layer 59B can be formed conformally, for example, by chemical vapor deposition (CVD). The thickness of the second dielectric mask layer 59B can be from 1 nm to 20 nm, although lesser and greater thicknesses can also be employed.

A semiconductor material is selectively deposited on the physically exposed portions of the semiconductor surface of the second top semiconductor portion 31B. The semiconductor material can be deposited, for example, by selective epitaxy.

Second raised semiconductor material portions (34B, 34B') are formed on, and above, the top surface of the second top semiconductor portion 31B. In one embodiment, the second raised semiconductor material portions (34B, 34B') can be in-situ doped with electrical dopants, i.e., p-type dopants or n-type dopants. In one embodiment, the second top semiconductor portion 31B can include an intrinsic semiconductor material, and the second raised semiconductor material portions (34B, 34B') can include p-type dopants or n-type dopants. In one embodiment, the second top semiconductor portion 31B can include electrical dopants of the second conductivity type, which is the same as the conductivity type of the in-situ doped first raised semiconductor material portions (34A, 34A') in some embodiments, and the second raised semiconductor material portions (34B, 34B') can include electrical dopants of the first conductivity type. If the second raised semiconductor material portions (34B, 34B') are formed with in-situ doping of electrical dopants, the second raised semiconductor material portions (34B, 34B') are raised source and drain regions which are located above a topmost surface of a channel of another field effect transistor to be subsequently formed.

The optional second disposable bottom dielectric material portion 25B or the second disposable dielectric material portion 27B is in contact with a first portion of the topmost surface of the second top semiconductor portion 31B. One of the second raised semiconductor material portions 34B is in contact with a second portion of the topmost surface of the second top semiconductor portion 31B. The other of the second raised semiconductor material portions 34B' is in contact with a third portion of the topmost surface of the second top semiconductor portion 31B.

In one embodiment, the thickness of second raised semiconductor material portions (34B, 34B') can be greater than the thickness of the top semiconductor layer 30. The thickness of the second raised semiconductor material portions (34B, 34B') can be less than the height of the second disposable dielectric structure (25B, 27B, 29B).

In one embodiment, the second top semiconductor portion 31B and the second raised semiconductor material portions (34B, 34B') can include a same semiconductor material, which can be the same as, or different from, the first semiconductor material of the first top semiconductor portion 31A.

In one embodiment, the second top semiconductor portion 31B can includes a semiconductor material, which can be the same as, or different from, the first semiconductor material of the first top semiconductor portion 31A. The second raised semiconductor material portions (34B, 34B') can include another semiconductor material that is different from the semiconductor material of the second top semiconductor portion 31B. In a non-limiting illustrative example, the semiconductor material of the second top semiconductor portion 31B can be silicon, and the semiconductor material of the second raised semiconductor material portions (34B, 34B') can be a silicon carbon alloy or a silicon germanium alloy, and is different from the semiconductor material of the first raised semiconductor material portions (34A, 34A').

In one embodiment, the second top semiconductor portion 31B and the second raised semiconductor material portions (34B, 34B') can include a same single crystalline semiconductor material, which can be the same as, or different from, the first semiconductor material of the first top semiconductor portion 31A.

In one embodiment, the second top semiconductor portion 31B can includes a single crystalline semiconductor material, which can be the same as, or different from, the first semiconductor material of the first top semiconductor portion 31A. The second raised semiconductor material portions (34B, 34B') can include another single crystalline semiconductor material that is different from the semiconductor material of the second top semiconductor portion 31B. In a non-limiting illustrative example, the single crystalline semiconductor material of the second top semiconductor portion 31B can be single crystalline silicon, and the semiconductor material of the second raised semiconductor material portions (34B, 34B') can be a single crystalline silicon carbon alloy or a single crystalline silicon germanium alloy, and is different from the semiconductor material of the first raised semiconductor material portions (34A, 34A').

Figure 5:
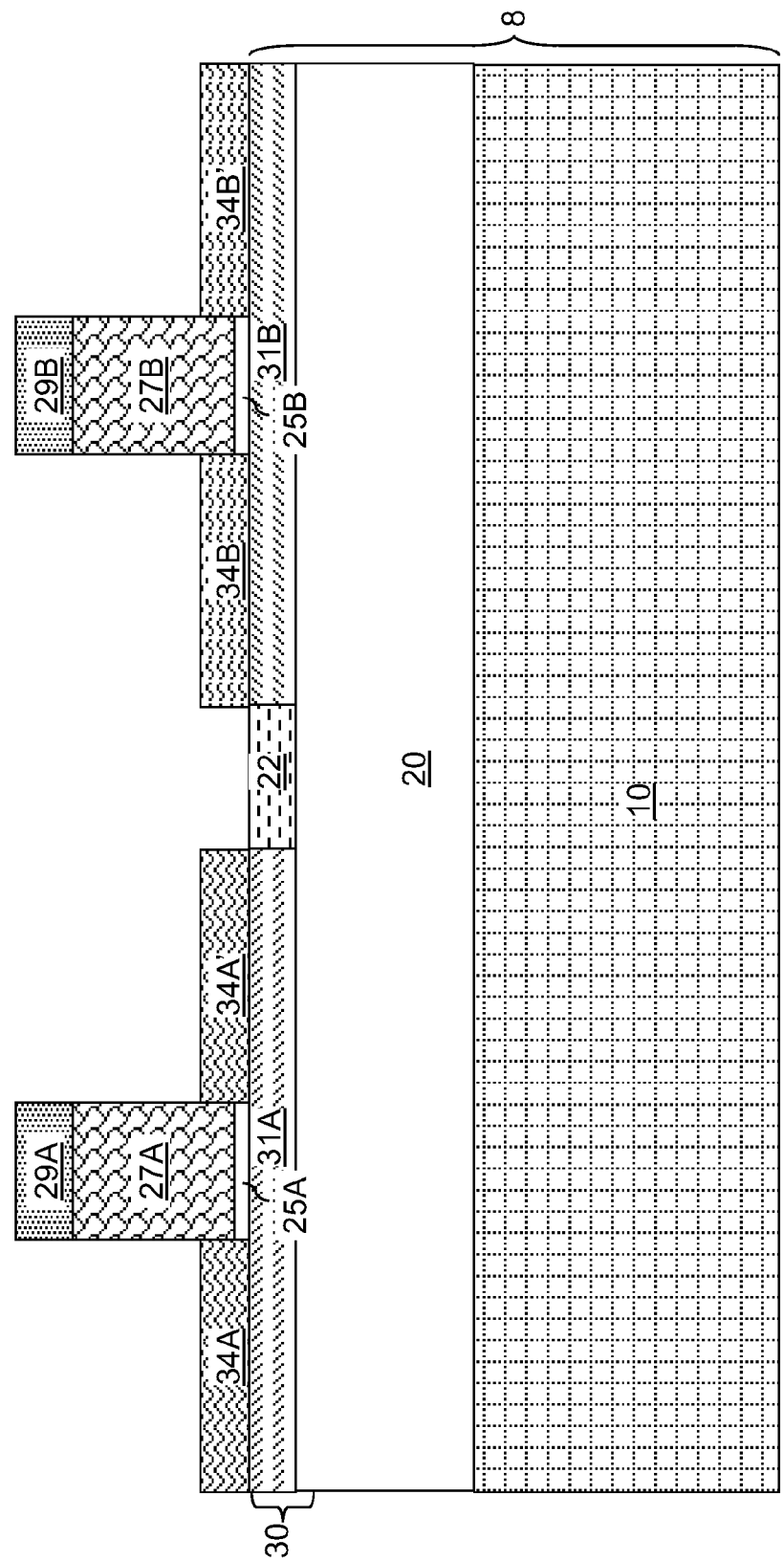
FIG. 5 is vertical cross-sectional view of the first exemplary semiconductor structure after removal of the second dielectric mask layer according to the first embodiment of the present disclosure.

Referring to FIG. 5, the second dielectric mask layer 59B is subsequently removed, for example, by an isotropic etch such as a wet etch.

Figure 6:
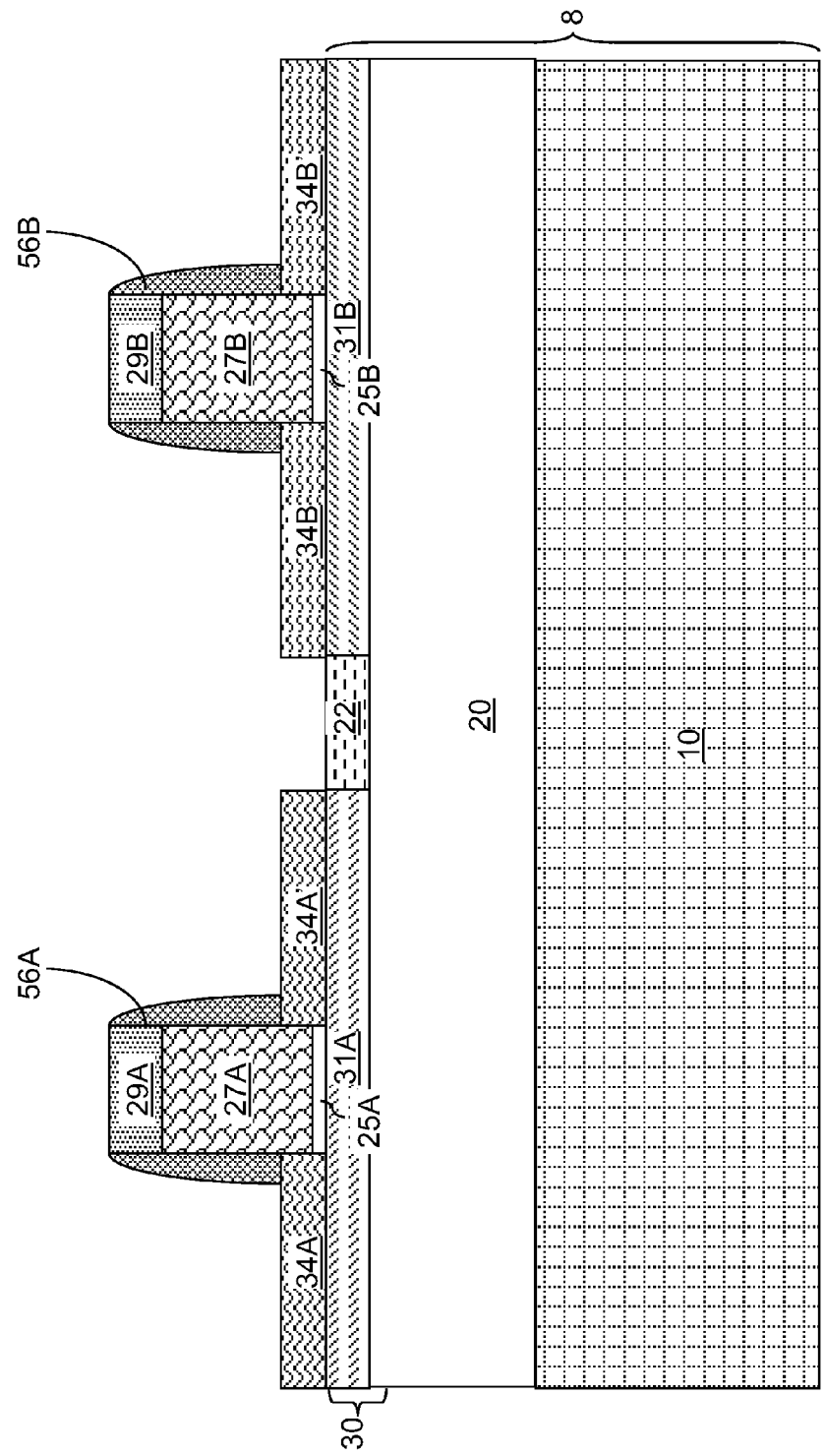
FIG. 6 is a vertical cross-sectional view of the first exemplary semiconductor structure after formation of inner dielectric gate spacers according to the first embodiment of the present disclosure.

Referring to FIG. 6, dielectric gate spacers are formed on the sidewalls of the first disposable dielectric structure (25A, 27A, 29A) and the second disposable dielectric structure (25B, 27B, 29B). Specifically, a first inner dielectric gate spacer 56A is formed on the sidewalls of the first disposable dielectric structure (25A, 27A, 29A), and a second inner dielectric gate spacer 56B is formed on the sidewalls of the second disposable dielectric structure (25B, 27B, 29B). The first inner dielectric gate spacer 56A and the second inner dielectric gate spacer 56B can be formed by depositing a conformal dielectric layer, and anisotropically etching the conformal dielectric layer to remove horizontal portions of the conformal dielectric layer. The first inner dielectric gate spacer 56A and the second inner dielectric gate spacer 56B are remaining portions of the conformal dielectric layer.

The first and second inner dielectric gate spacers (56A, 56B) include a dielectric material that is different from the dielectric material of the first and second disposable dielectric material portions (27A, 27B). For example, the dielectric material of the first and second disposable dielectric material portions (27A, 27B) can be silicon oxide or organosilicate glass, and the dielectric material of the first and second inner dielectric gate spacers (56A, 56B) can be silicon nitride. The thickness of the first and second inner dielectric gate spacers (56A, 56B), as measured at the base of the first and second inner dielectric gate spacers (56A, 56B), can be from 5 nm to 100 nm, although lesser and greater thicknesses can also be employed.

Figure 7:
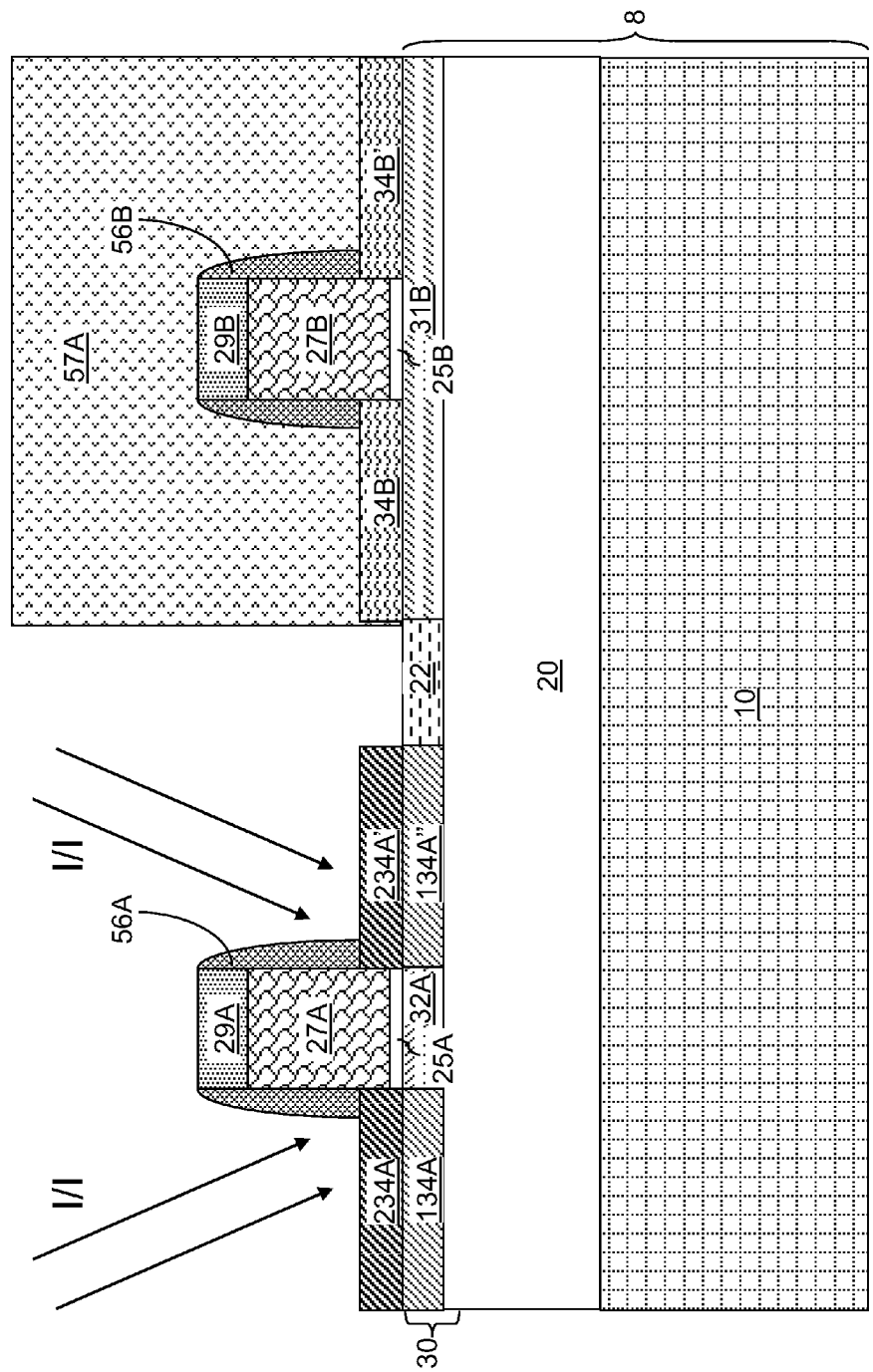
FIG. 7 is a vertical cross-sectional view of the first exemplary semiconductor structure after a first masked extension implantation according to the first embodiment of the present disclosure.

Referring to FIG. 7, a first source region and a first drain region are formed. The first source region includes a vertical stack of a first planar source region 134A and a first raised source region 234A. The first drain region includes a vertical stack of a first planar drain region 134A' and a first raised drain region 234A'. The first planar source region 134A is located within the top semiconductor layer 30 and contacts a bottom surface of the first raised source region 234A. The first planar drain region 134A' is located with the top semiconductor layer 30 and contacts a bottom surface of the first raised drain region 234A'.

The first planar source region 134A, the first planar drain region 134A', the first raised source region 234A, and the first raised drain region 234A' are doped with electrical dopants of a same conductivity type. If the first top semiconductor portion 31A is intrinsic, the first planar source region 134A, the first planar drain region 134A', the first raised source region 234A, and the first raised drain region 234A' can be p-doped or n-doped. If the first top semiconductor portion 31A has a doping of a first conductivity type, the first planar source region 134A, the first planar drain region 134A', the first raised source region 234A, and the first raised drain region 234A' have a doping of a second conductivity type, which is the opposite of the first conductivity type.

The first planar source region 134A is formed by conversion of a portion of the first top semiconductor portion 31A by introduction of electrical dopants by ion implantation and/or by diffusion from an in-situ doped first raised semiconductor material portion 34A. The first planar drain region 134A' is formed by conversion of another portion of the first top semiconductor portion 31A by introduction of electrical dopants by ion implantation and/or by diffusion from another in-situ doped first raised semiconductor material portion 34A'.

In one embodiment, a first implantation mask 57A is formed over the second disposable dielectric structure (25B, 27B, 29B), the second inner dielectric gate spacer 56B, and the second raised semiconductor material portions (34B, 34B'), while physically exposing the first disposable dielectric structure (25A, 27A, 29A), the first inner dielectric gate spacer 56A, and the first raised semiconductor material portions (34A, 34A'; See FIG. 6). The first implantation mask 57A can be, for example, a lithographically patterned layer of a photoresist. Electrical dopants are implanted into the first raised semiconductor material portions (34A, 34A') and underlying portions of the first top semiconductor portion 31A employing the first inner dielectric gate spacer 56A as a part of the implantation mask. The electrical dopants are of the opposite conductivity type of the type of doping of the first top semiconductor portion 31A, if the first top semiconductor portion 31A is doped.

In one embodiment, the first raised semiconductor material portions (34A, 34A') are formed with in-situ doping at the processing step of FIG. 3, and as such, are a raised source region and a raised drain region upon formation as the first raised semiconductor material portions (34A, 34A'). Electrical dopants of the same conductivity type as the electrical dopants present in the first raised semiconductor material portions (34A, 34A') are added during the ion implantation so that the raised source region 234A and the raised drain region 234A' as formed at the processing step of FIG. 7 has a greater concentration of electrical dopants than the raised source region and the raised drain region as formed at the processing step of FIG. 3.

In one embodiment, the first raised semiconductor material portions (34A, 34A') are formed as intrinsic semiconductor material portions at the processing step of FIG. 3. Electrical dopants are implanted into the first raised semiconductor material portions (34A, 34A') during the ion implantation, thereby converting the intrinsic first raised semiconductor material portions (34A, 34A') into the raised source region 234A and the raised drain region 234A'. Thus, the first raised source region 234A and first raised drain region 234A' contact sidewalls of the first disposable dielectric structure (25A, 27A, 29A) upon formation. The first implantation mask 57A is subsequently removed, for example, by ashing.

In one embodiment, a first implantation mask 57A or ion implantation is not employed, and the first raised semiconductor material portions (34A, 34A') are formed with in-situ doping at the processing step of FIG. 3, and as such, are a raised source region and a raised drain region upon formation as the first raised semiconductor material portions (34A, 34A'). A thermal anneal is performed at a processing step corresponding the step of FIG. 7 and/or at a later processing step to diffuse out the electrical dopants present within the raised source region and the raised drain region, i.e., the first raised semiconductor material portions (34A, 34A') as formed with in-situ doping. The downward diffusion of the electrical dopants from the raised source region and the raised drain region converts underlying portions of the first top semiconductor portion 31A become a first planar source region 134A and a first planar drain region 134A'. The raised source region and the raised drain region after some electrical dopants diffuse out into the underlying portions of the first top semiconductor portion 31A are the raised source region 234A and the raised drain region 234A' in a modification of the structure of FIG. 7 (without the first implantation mask 57A).

A remaining portion of the first top semiconductor portion 31A that is not doped with additional electrical dopants, i.e., having the same doping as the first top semiconductor portion 31A as provided at the processing step of FIG. 1, is herein referred to as a first body region 32A.

Figure 8:
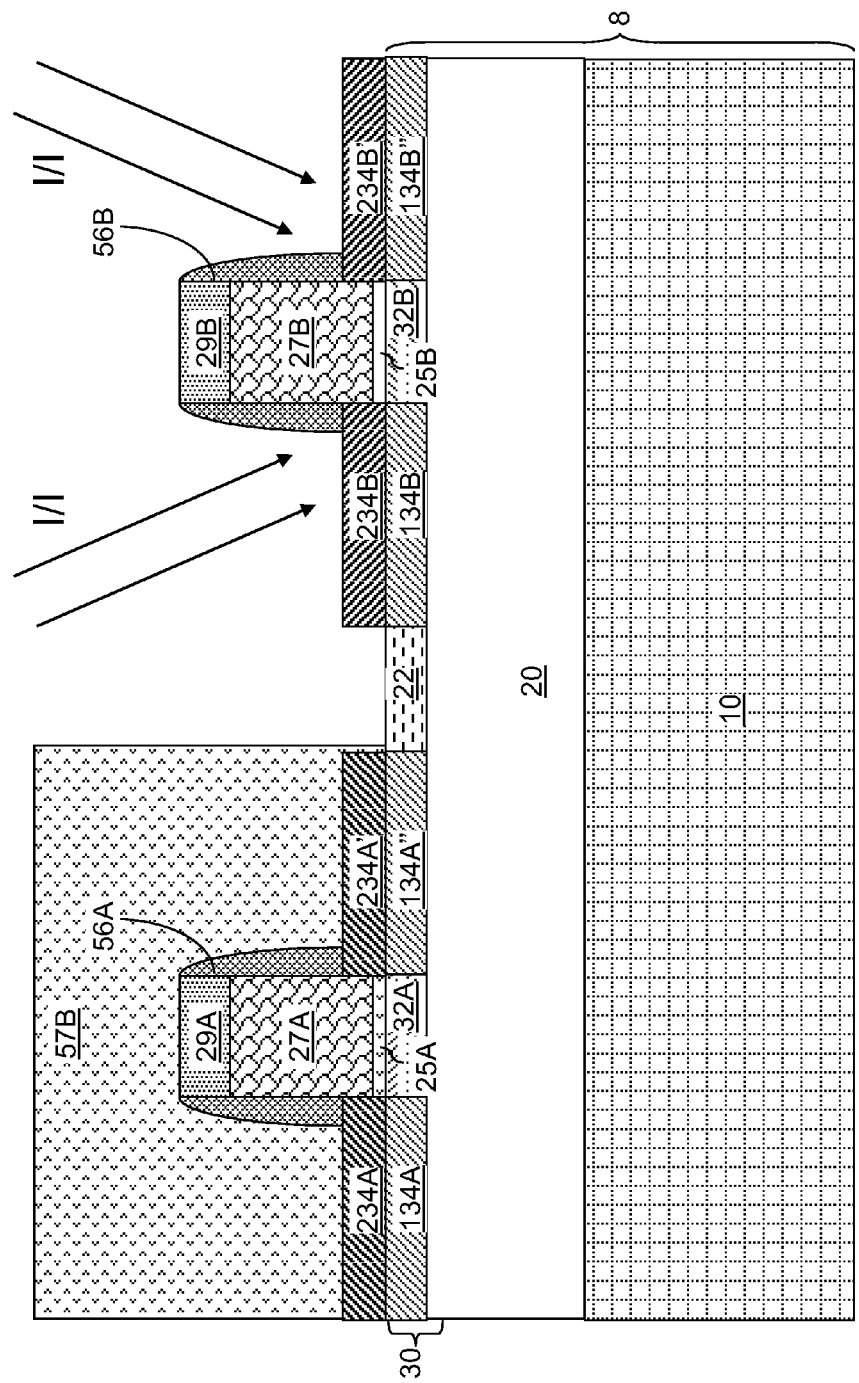
FIG. 8 is a vertical cross-sectional view of the first exemplary semiconductor structure after a second masked extension implantation according to the first embodiment of the present disclosure.

Referring to FIG. 8, a second source region and a second drain region are formed. The second source region includes a vertical stack of a second planar source region 134B and a second raised source region 234B. The second drain region includes a vertical stack of a second planar drain region 134B' and a second raised drain region 234B'. The second planar source region 134B is located within the top semiconductor layer 30 and contacts a bottom surface of the second raised source region 234B. The second planar drain region 134B' is located with the top semiconductor layer 30 and contacts a bottom surface of the second raised drain region 234B'.

The second planar source region 134B, the second planar drain region 134B', the second raised source region 234B, and the second raised drain region 234B' are doped with electrical dopants of a same conductivity type. If the second top semiconductor portion 31B is intrinsic, the second planar source region 134B, the second planar drain region 134B', the second raised source region 234B, and the second raised drain region 234B' can be p-doped or n-doped. If the second top semiconductor portion 31B has a doping of a second conductivity type, the second planar source region 134B, the second planar drain region 134B', the second raised source region 234B, and the second raised drain region 234B' have a doping of a second conductivity type, which is the opposite of the second conductivity type.

In one embodiment, the second planar source region 134B, the second planar drain region 134B', the second raised source region 234B, and the second raised drain region 234B' have an opposite type of doping than the first planar source region 134A, the first planar drain region 134A', the first raised source region 234A, and the first raised drain region 234A'.

The second planar source region 134B is formed by conversion of a portion of the second top semiconductor portion 31B by introduction of electrical dopants by ion implantation and/or by diffusion from an in-situ doped second raised semiconductor material portion 34B. The second planar drain region 134B' is formed by conversion of another portion of the second top semiconductor portion 31B by introduction of electrical dopants by ion implantation and/or by diffusion from another in-situ doped second raised semiconductor material portion 34B'.

In one embodiment, a second implantation mask 57B is formed over the first disposable dielectric structure (25A, 27A, 29A), the first inner dielectric gate spacer 56A, the first source region (134A, 234A), and the first drain region (134A', 234A'), while physically exposing the second disposable dielectric structure (25B, 27B, 29B), the second inner dielectric gate spacer 56B, and the second raised semiconductor material portions (34B, 34A'; See FIG. 7). The second implantation mask 57B can be, for example, a lithographically patterned layer of a photoresist. Electrical dopants are implanted into the second raised semiconductor material portions (34B, 34B') and underlying portions of the second top semiconductor portion 31B employing the second inner dielectric gate spacer 56B as a part of the implantation mask. The electrical dopants are of the opposite conductivity type of the type of doping of the second top semiconductor portion 31B, if the second top semiconductor portion 31B is doped.

In one embodiment, the second raised semiconductor material portions (34B, 34B') are formed with in-situ doping at the processing step of FIG. 4, and as such, are a raised source region and a raised drain region upon formation as the second raised semiconductor material portions (34B, 34B'). Electrical dopants of the same conductivity type as the electrical dopants present in the second raised semiconductor material portions (34B, 34B') are added during the ion implantation so that the raised source region 234B and the raised drain region 234B' as formed at the processing step of FIG. 8 has a greater concentration of electrical dopants than the raised source region and the raised drain region as formed at the processing step of FIG. 4.

In one embodiment, the second raised semiconductor material portions (34B, 34B') are formed as intrinsic semiconductor material portions at the processing step of FIG. 3. Electrical dopants are implanted into the second raised semiconductor material portions (34B, 34B') during the ion implantation, thereby converting the intrinsic second raised semiconductor material portions (34B, 34B') into the raised source region 234B and the raised drain region 234B'. Thus, the second raised source region 234B and second raised drain region 234B' contact sidewalls of the second disposable dielectric structure (25B, 27B, 29B) upon formation. The second implantation mask 57B is subsequently removed, for example, by ashing.

In one embodiment, a second implantation mask 57B or ion implantation is not employed, and the second raised semiconductor material portions (34B, 34B') are formed with in-situ doping at the processing step of FIG. 4, and as such, are a raised source region and a raised drain region upon formation as the second raised semiconductor material portions (34B, 34B'). A thermal anneal is performed at a processing step corresponding the step of FIG. 8 and/or at a later processing step to diffuse out the electrical dopants present within the raised source region and the raised drain region, i.e., the second raised semiconductor material portions (34B, 34B') as formed with in-situ doping. The downward diffusion of the electrical dopants from the raised source region and the raised drain region converts underlying portions of the second top semiconductor portion 31B become a second planar source region 134B and a second planar drain region 134B'. The raised source region and the raised drain region after some electrical dopants diffuse out into the underlying portions of the second top semiconductor portion 31B are the raised source region 234B and the raised drain region 234B' in a modification of the structure of FIG. 7 (without the second implantation mask 57B).

A remaining portion of the second top semiconductor portion 31B that is not doped with additional electrical dopants, i.e., having the same doping as the second top semiconductor portion 31B as provided at the processing step of FIG. 1, is herein referred to as a second body region 32B.

Figure 9:
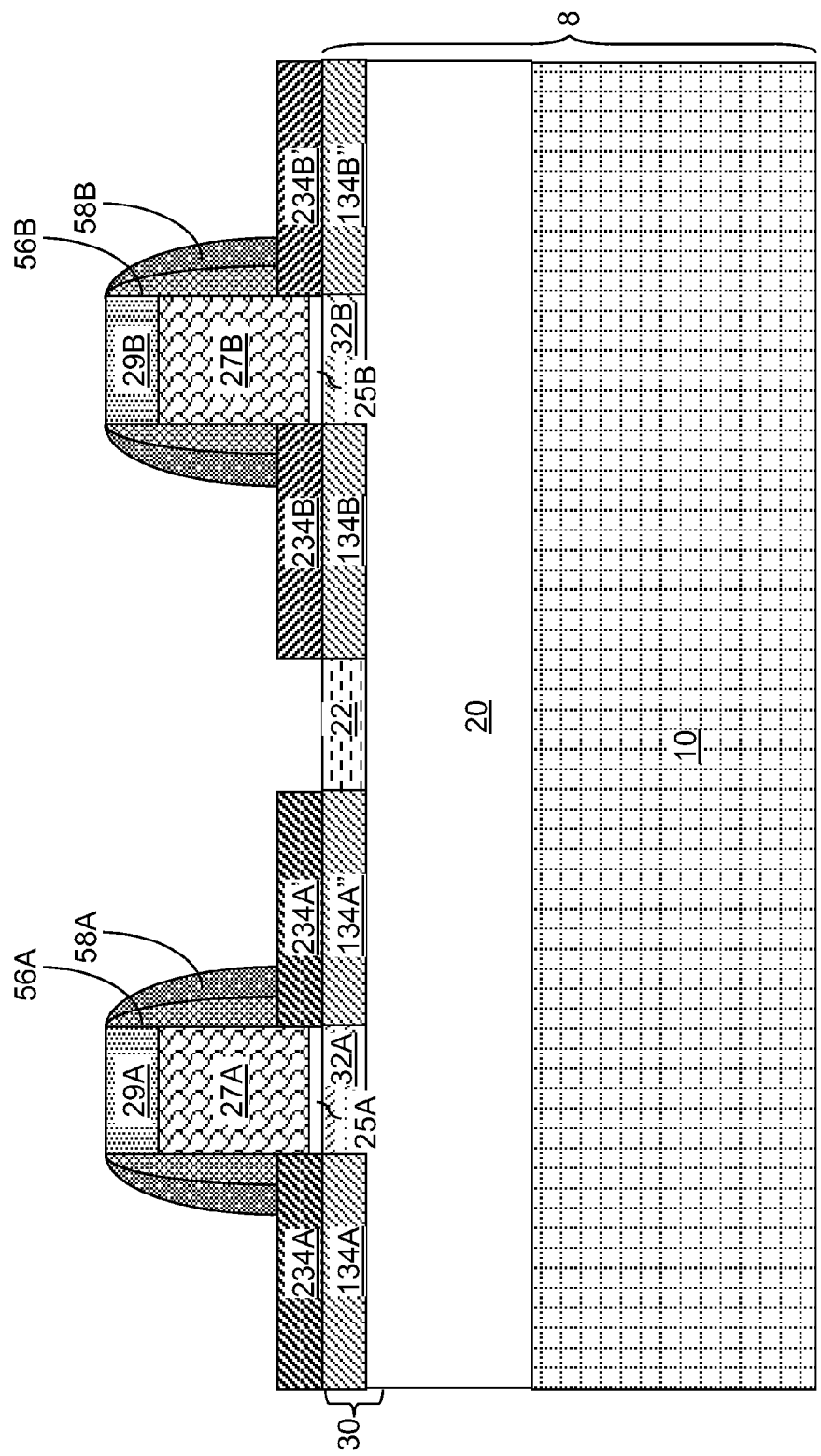
FIG. 9 is a vertical cross-sectional view of the first exemplary semiconductor structure after formation of outer dielectric gate spacers according to the first embodiment of the present disclosure.

Referring to FIG. 9, outer dielectric gate spacers are formed. Specifically, a conformal dielectric material layer is deposited, for example, by chemical vapor deposition (CVD) or atomic layer deposition (ALD), and is anisotropically etched to remove horizontal portions of the conformal dielectric material layer. Remaining vertical portions of the conformal dielectric material layer form the outer dielectric gate spacers. For example, a first outer dielectric gate spacer 58A is formed on the outer sidewalls of the first inner dielectric gate spacer 56A, and a second outer dielectric gate spacer 58B is formed on the outer sidewalls of the second inner dielectric gate spacer 56B. The thickness of the first and second outer dielectric gate spacers (58A, 58B), as measured at a bottom thereof, can be from 5 nm to 100 nm, although lesser and greater thicknesses can also be employed.

Figure 10:
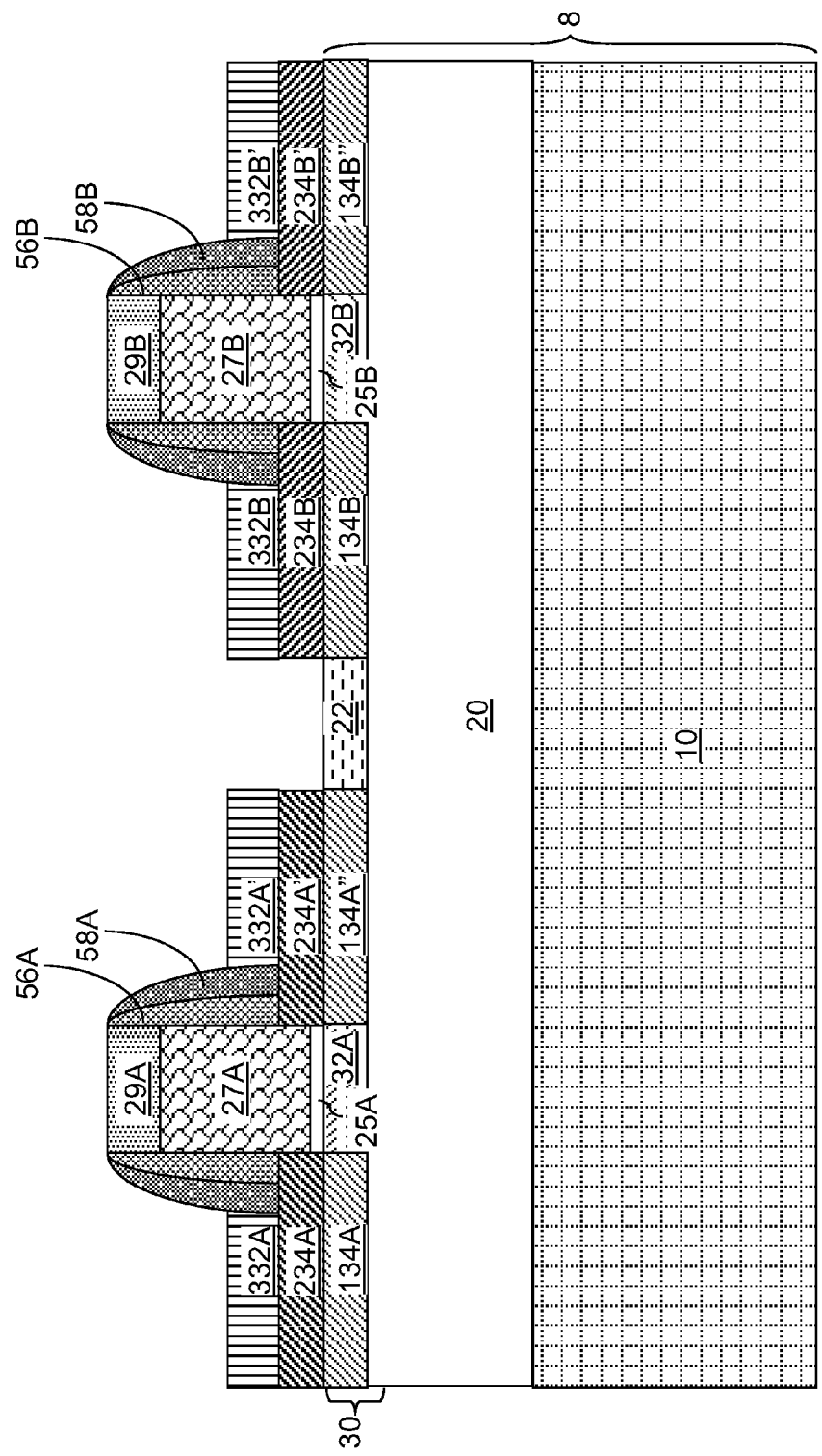
FIG. 10 is a vertical cross-sectional view of the first exemplary semiconductor structure after formation of elevated semiconductor material portions according to the first embodiment of the present disclosure.

Referring to FIG. 10, elevated semiconductor material portions are formed by selectively depositing semiconductor materials on top surfaces of the raised source regions (234A, 234B) and the raised drain regions (234B, 234B'), while preventing deposition of any semiconductor material on dielectric surfaces such as the surfaces of the first and second outer dielectric gate spacers (58A, 58B), the top surfaces of the first disposable dielectric structure (25A, 27A, 29A) and the second disposable dielectric structure (25B, 27B, 29B), and the top surface of the shallow trench isolation structure 22. The elevated semiconductor material portions include a first source-side elevated semiconductor material portion 332A that is deposited on the top surface of the first raised source region 234A, a first drain-side elevated semiconductor material portion 332A' that is deposited on the top surface of the first raised drain region 234A', a second source-side elevated semiconductor material portion 332B that is deposited on the top surface of the second raised source region 234B, and a second drain-side elevated semiconductor material portion 332B' that is deposited on the top surface of the second raised drain region 234B'. The elevated semiconductor material portions (332A, 332A', 332B, 332B') can include a doped or undoped semiconductor material such as silicon, a silicon carbon alloy, or a silicon germanium alloy. The thickness of the elevated semiconductor material portions (332A, 332A', 332B, 332B') can be from 1 nm to 100 nm. In one embodiment, the topmost surfaces of the elevated semiconductor material portions (332A, 332A', 332B, 332B') can be below the plane of the top surfaces of the first disposable dielectric structure (25A, 27A, 29A) and the second disposable dielectric structure (25B, 27B, 29B).

In one embodiment, the semiconductor material of the elevated semiconductor material portions (332A, 332A', 332B, 332B') is amorphous. In one embodiment, the semiconductor material of the elevated semiconductor material portions (332A, 332A', 332B, 332B') is polycrystalline. In one embodiment, the semiconductor material of the elevated semiconductor material portions (332A, 332A', 332B, 332B') is single crystalline, and is epitaxially aligned to a single crystalline semiconductor material in the raised source and drain regions (234A, 234A', 234B, 234B').

Figure 11:
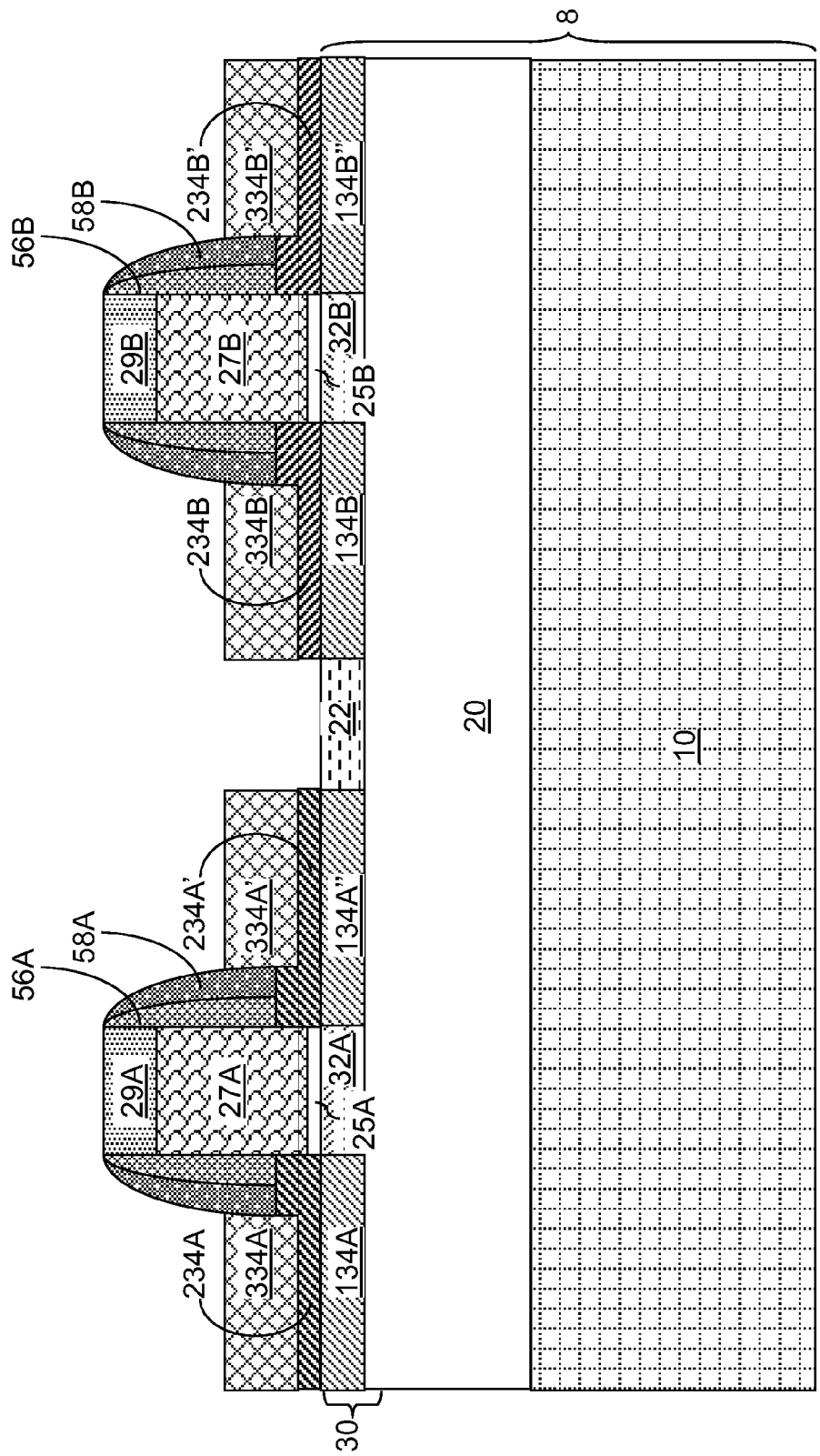
FIG. 11 is a vertical cross-sectional view of the first exemplary semiconductor structure after formation of various metal semiconductor alloy portions according to the first embodiment of the present disclosure.

Referring to FIG. 11, various metal semiconductor alloy portions are formed by reacting semiconductor materials having physically exposed top surfaces into metal semiconductor alloy portions. Specifically, the various elevated semiconductor material portions (332A, 332A', 332B, 332B') and optionally, the upper portions of the raised source regions (234A, 234B) and raised drain regions (234B, 234B') are converted into metal semiconductor alloy portions, which include a first source-side metal semiconductor alloy portion 334A, a first drain-side metal semiconductor alloy portion 334A', a second source-side metal semiconductor alloy portion 334B, and a second drain-side metal semiconductor alloy portion 334B'.

The various metal semiconductor alloy portions (334A, 334A', 334B, 334B') can be formed, for example, by deposition of a metal on physically exposed top surfaces if the raised source and drain regions (234A, 234A', 234B, 234B'), and reacting the metal with the underlying semiconductor material during a thermal anneal at an elevated temperature. The first source-side metal semiconductor alloy portion 334A contacts a top surface of the first raised source region 234A and has a top surface that is above the plane of the bottom surfaces of the first inner dielectric gate spacer 56A and the first outer dielectric gate spacer 58A. The first drain-side metal semiconductor alloy portion 334A' contacts a top surface of the first raised drain region 234A' and has a top surface that is above the plane of the bottom surfaces of the first inner dielectric gate spacer 56A and the first outer dielectric gate spacer 58A. The second source-side metal semiconductor alloy portion 334B contacts a top surface of the second raised source region 234B and has a top surface that is above the plane of the bottom surfaces of the second inner dielectric gate spacer 56B and the second outer dielectric gate spacer 58B. The second drain-side metal semiconductor alloy portion 334B' contacts a top surface of the second raised drain region 234B' and has a top surface that is above the plane of the bottom surfaces of the second inner dielectric gate spacer 56B and the second outer dielectric gate spacer 58B.

The bottom surface of the first raised source region 234A and the bottom surface of the first raised drain region 234A' are located below the plane of the bottom surface of the first inner dielectric gate spacer 56A and the first outer dielectric gate spacer 58A. The bottom surface of the second raised source region 234B and the bottom surface of the second raised drain region 234B' are located below the plane of the bottom surface of the second inner dielectric gate spacer 56B and the second outer dielectric gate spacer 58B. The first source-side metal semiconductor alloy portion 334A and the first drain-side metal semiconductor alloy portion 334A' laterally contact outer sidewalls of the first outer dielectric gate spacer 58A. The second source-side metal semiconductor alloy portion 334B and the second drain-side metal semiconductor alloy portion 334B' laterally contact outer sidewalls of the second outer dielectric gate spacer 58B.

Each outer dielectric gate spacer (58A, 58B) laterally contacts outer sidewalls of an inner dielectric gate spacer (56A, 56B), overlies portions of a raised source region (234A or 234B) and a raised drain region (234A' or 234B'), and contacts a source-side metal semiconductor alloy portion (334A or 334B) and a drain-side metal semiconductor alloy portion (334A', 334B').

Figure 12:
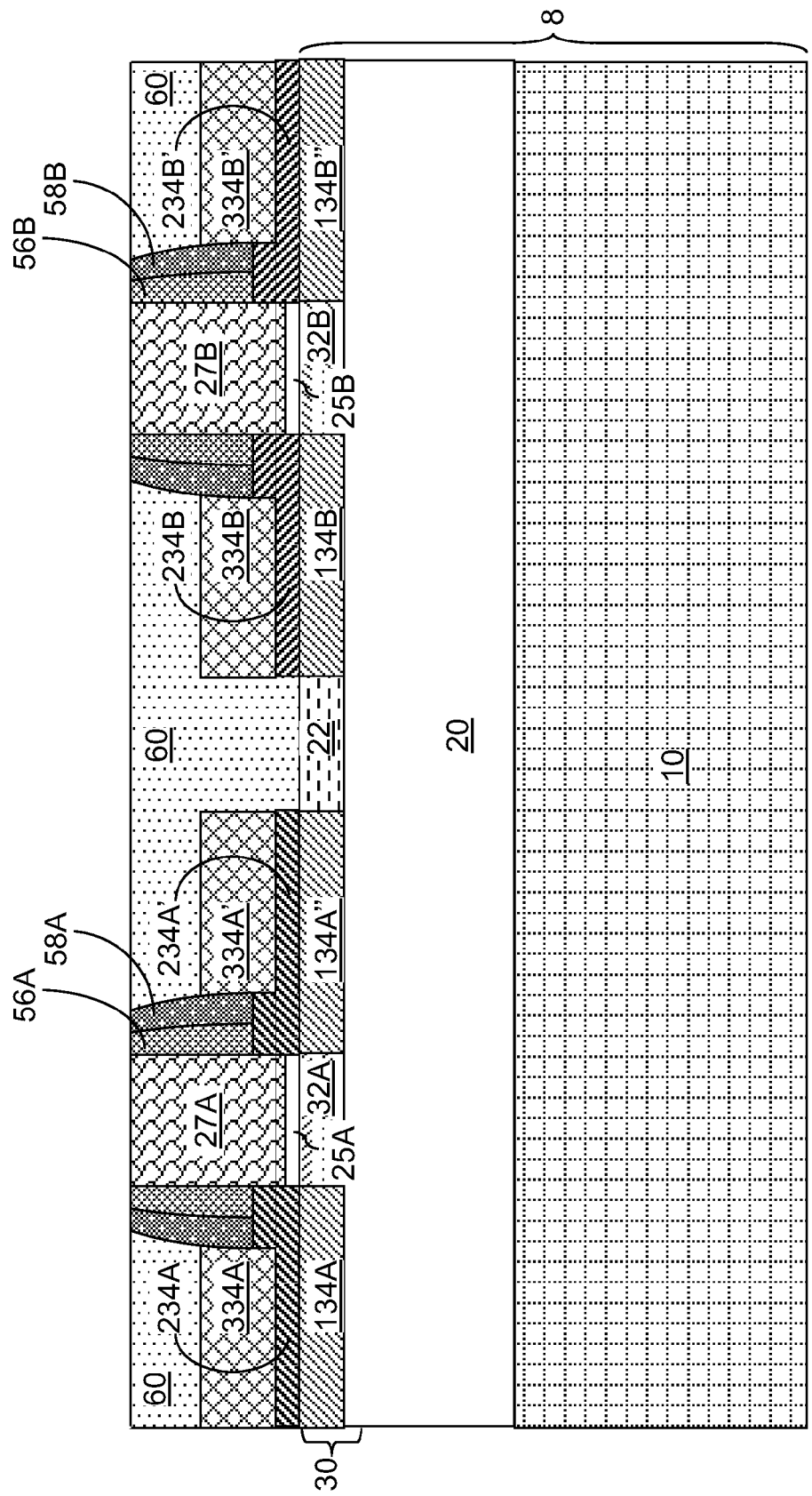
FIG. 12 is a vertical cross-sectional view of the first exemplary semiconductor structure after formation of a planarization dielectric layer and planarization of the planarization dielectric layer and upper portions of the disposable dielectric structures and various dielectric gate spacers according to the first embodiment of the present disclosure.

Referring to FIG. 12, a planarization dielectric layer 60 is deposited, for example, by chemical vapor deposition (CVD) or atomic layer deposition (ALD). The planarization dielectric layer 60 includes a dielectric material such as silicon oxide, silicon nitride, silicon oxynitride, a dielectric metal oxide, and/or organosilicate glass. The planarization dielectric layer 60 is subsequently planarized to, or below, the topmost surface of the first disposable dielectric material portion 27A within the first disposable dielectric structure (25A, 27A, 29A) and the topmost surface of the second disposable dielectric material portion 27B within the second disposable dielectric structure (25B, 27B, 29B). The planarization of the planarization dielectric layer 60 can be effected, for example, by chemical mechanical planarization (CMP). During the planarization of the planarization dielectric layer 60, the optional first and second disposable top dielectric material portion (29A, 29B) and upper portions of the various dielectric gate spacers (56A, 58A, 56B, 58B) are removed. A top surface of a remaining portion of each disposable dielectric structure (27A, 27B) is physically exposed by planarizing the planarization dielectric layer.

Figure 13:
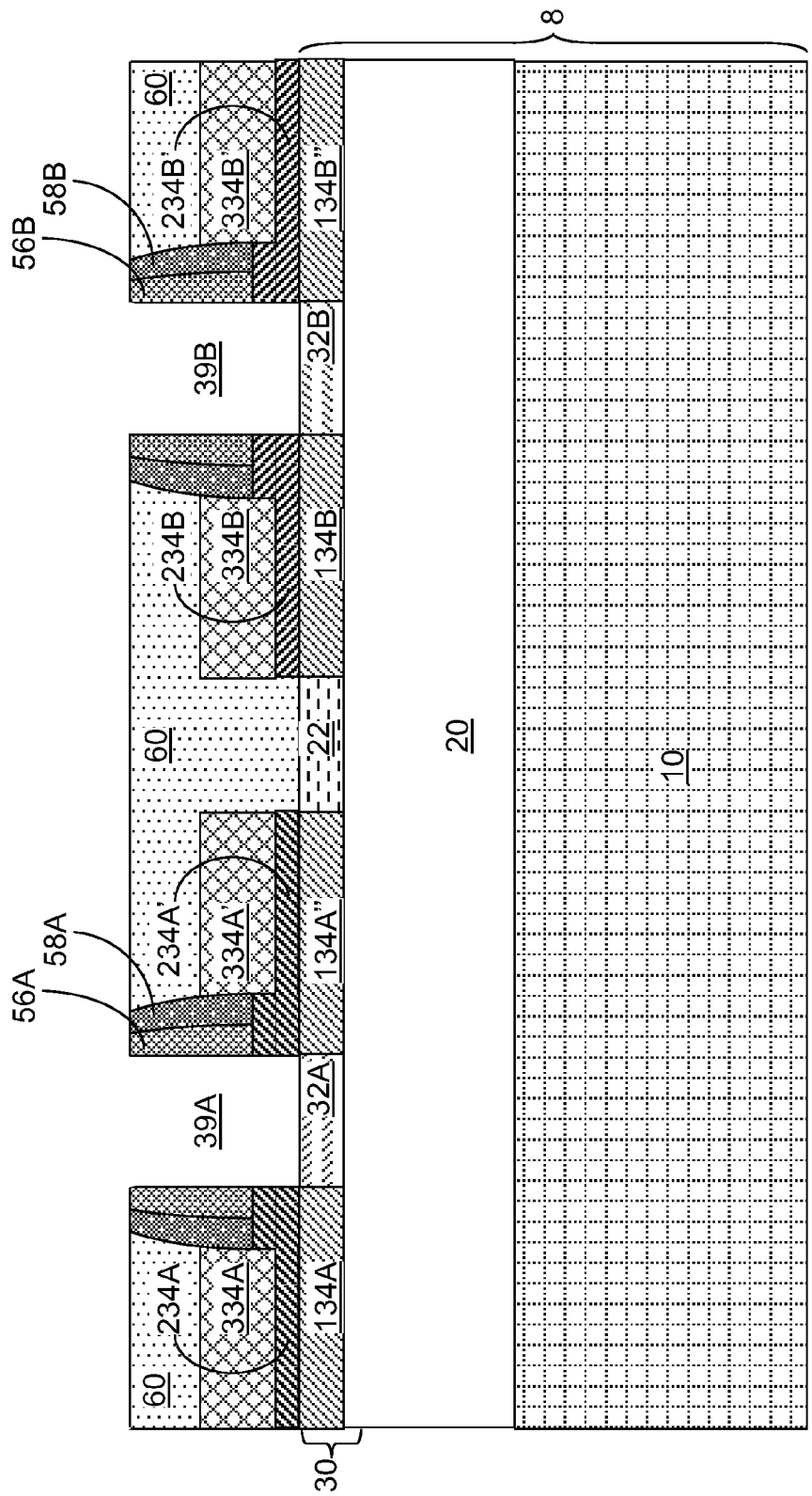
FIG. 13 is a vertical cross-sectional view of the first exemplary semiconductor structure after removal of disposable dielectric structures according to the first embodiment of the present disclosure.
Figure 14:
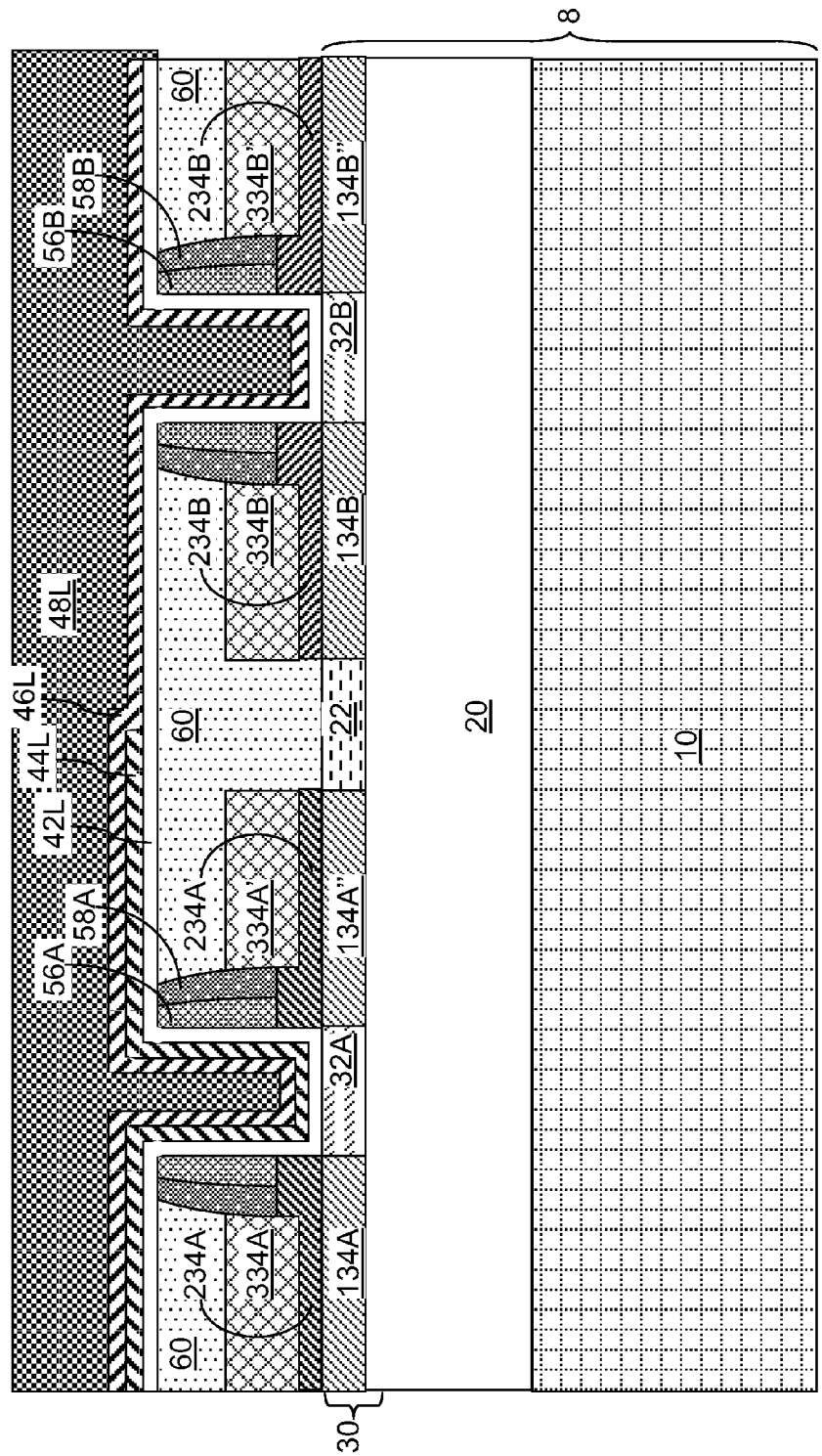
FIG. 14 is a vertical cross-sectional view of the first exemplary semiconductor structure after deposition of a gate dielectric layer, first and second metal gate layers (including their patterning), and a gate conductor portion layer according to the first embodiment of the present disclosure.

Referring to FIG. 13, the remaining portions of the disposable dielectric structures (25A, 27A, 25B, 27B) are removed selective to the materials of the planarization dielectric layer 60, the inner dielectric gate spacers (56A, 56B), the outer dielectric gate spacers (58A, 58B), the raised source and drain regions (234A, 234A'. 234B, 234B'), and the first and second body regions (32A, 32B). A first gate cavity 39A is formed within the volume from which the first disposable dielectric structure (25A, 27A) is removed, and a second gate cavity 39B is formed within the volume from which the second disposable dielectric structure (25B, 27B) is removed.

A contiguous gate dielectric layer 42L is deposited in the gate cavities (39A, 39B) and over the top surfaces of the inner and outer dielectric gate spacers (56A, 58A, 56B, 58B), and the planarization dielectric layer 60. The contiguous gate dielectric layer 42L can be a high dielectric constant (high-k) material layer having a dielectric constant greater than 3.9. The contiguous gate dielectric layer 42L can include a dielectric metal oxide, which is a high-k material containing a metal and oxygen, and is known in the art as high-k gate dielectric materials. Dielectric metal oxides can be deposited by, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 42L, as measured at horizontal portions, can be from 0.9 nm to 6 nm, and preferably from 1.0 nm to 3 nm. The contiguous gate dielectric layer 42L may have an effective oxide thickness on the order of or less than 2 nm. The entirety of the interface between the contiguous dielectric layer 42L and the horizontal surfaces of the silicon nitride gate spacers 52, the silicon nitride liners 60, and the planarization dielectric layer 60 is planar. An optional interface layer of a semiconductor oxide or oxinitride may be present between the gate dielectric layer 42L and the semiconductor channel region 32A and 32B.

A first work function metallic layer 44L is deposited on the contiguous gate dielectric layer 42L, and is lithographically patterned to be present with the first gate cavity 39A, while being absent within the second gate cavity 39B. The first work function metallic layer 44L includes a metallic material that can optimize the threshold voltages of transistors. For example, the first work function metallic layer 44L can include metallic materials such as Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, conductive nitrides thereof, and alloys thereof. The first work function metallic layer 44L can be formed, for example, by physical vapor deposition, chemical vapor deposition, or atomic layer deposition (ALD). The thickness of the first work function metallic layer 44L can be from 2 nm to 48 nm, although lesser and greater thicknesses can also be employed.

A second work function metallic layer 46L is deposited on the physically exposed surfaces of the first work function metallic layer 44L and the contiguous gate dielectric layer 42L. The second work function metallic layer 46L includes a metallic material that can optimize the threshold voltages of transistors. The metallic material of the second work function metallic layer 46L can be different from the metallic material of the first work function metallic layer 44L. For example, the second work function metallic layer 46L can include any metallic material that can be selected for the metallic material of the first work function metallic layer 44L. The second work function metallic layer 46L can be formed, for example, by physical vapor deposition, chemical vapor deposition, or atomic layer deposition (ALD). The thickness of the second work function metallic layer 46L can be from 2 nm to 48 nm, although lesser and greater thicknesses can also be employed.

A gate conductor portion layer 48L is deposited over the first and second work function metallic layers (44L, 46L). The gate conductor portion layer 48L includes a conductive material, which can be deposited by physical vapor deposition or chemical vapor deposition. For example, the gate conductor portion layer 48L can be an aluminum layer, an aluminum alloy layer, a tungsten layer, and/or a tungsten alloy layer deposited by physical vapor deposition. The thickness of the gate conductor portion layer 48L, as measured in a planar region of the conductive metal layer 48L above the topmost surface of the second work function metallic layer 46L, can be from 100 nm to 500 nm, although lesser and greater thicknesses can also be employed. In one embodiment, the gate conductor portion layer 48L can include a single elemental metal such as Al or W, or can include alloys Al and/or W.

Figure 15:
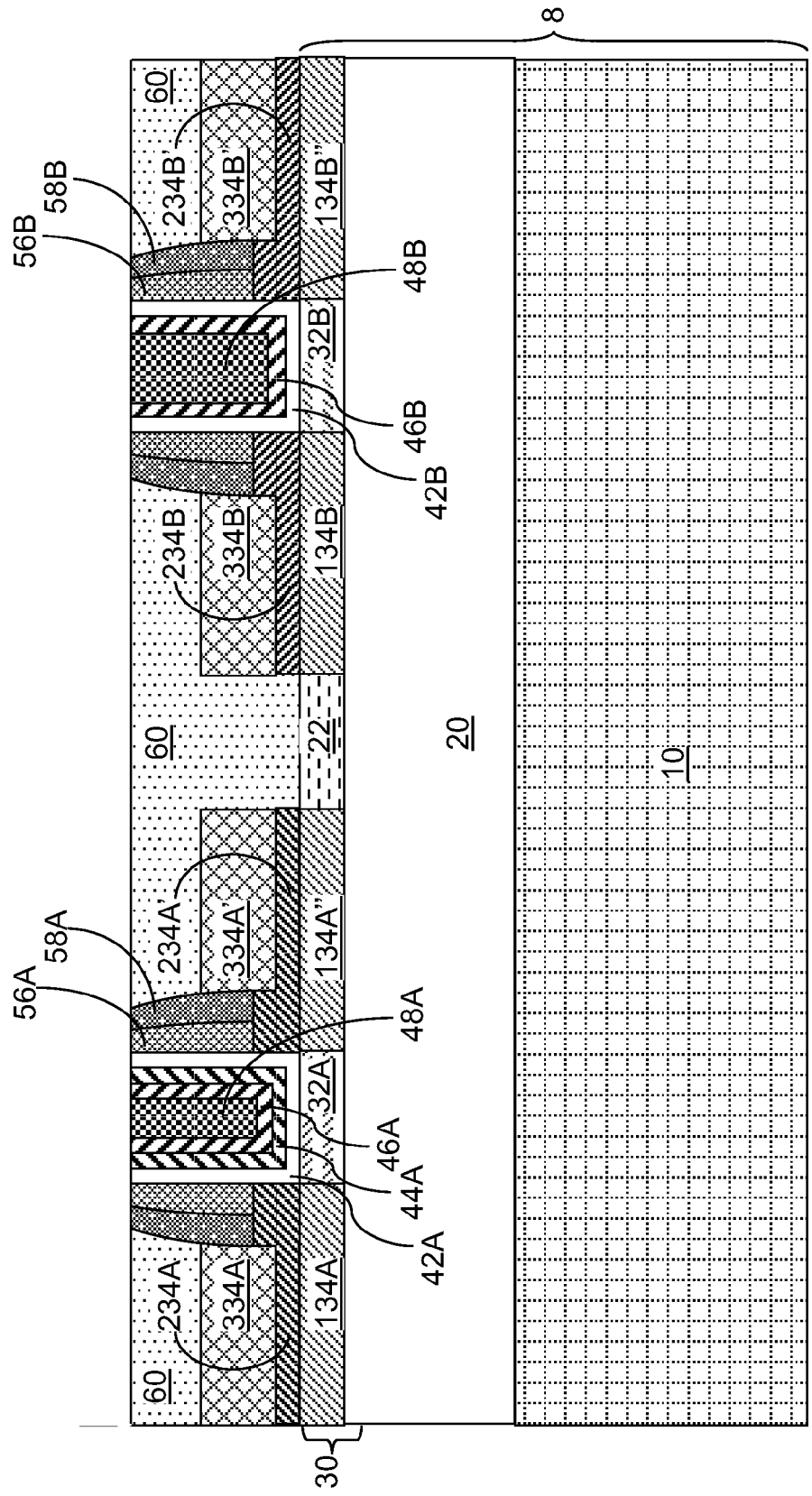
FIG. 15 is a vertical cross-sectional view of the first exemplary semiconductor structure after a planarization process to form replacement gate structures according to the first embodiment of the present disclosure.

Referring to FIG. 15, portions of the gate conductor portion layer 48L, portions of the first and second work function metallic layers (44L, 46L), and portions the contiguous gate dielectric layer 42L are removed from above the top planar surface of the planarization dielectric layer 60 by performing a planarization process such as chemical mechanical planarization (CMP) and/or a non-selective recess etch. Replacement gate structures are formed within volumes that are previously occupied by disposable dielectric structures (25A, 27A, 25B, 27B; See FIG. 12). Each replacement gate structure is a gate stack that remains permanently on the semiconductor substrate 8, i.e., is not disposable.

A first gate dielectric 42A, a first work function metal portion 44A, a second work function metal portion 46A, and a first gate conductor portion 48A are present with a first replacement gate structure (42A, 44A, 46A, 48A). A second gate dielectric 42B, another second work function metal portion 46B, and a second gate conductor portion 48B are present with a second replacement gate structure (42B, 46B, 48B). Each gate dielectric (42A, 42B) is a remaining portion of the contiguous gate dielectric layer 42L after the planarization process. Each first work function metal portion 44A is a remaining portion of the first work function metallic layer 44L after the planarization process. Each second work function metal portion (46A, 46B) is a remaining portion of the second work function metallic layer 46L after the planarization process. Each gate conductor portion (48A, 48B) is a remaining portion of the gate conductor portion layer 48L after the planarization process. Each replacement gate structure (42A, 44A, 46A, 48A, 42B, 46B, 48B) can overlie a channel region of a field effect transistor. A stack of the first work function metal portion 44A, the second work function metal portion 46A, and the first gate conductor portion 48A constitutes a first gate electrode (44A. 46A, 48A). A stack of the other second work function metal portion 46B and the second gate conductor portion 48B constitutes a second gate electrode (46B, 48B).

Each gate dielectric (42A, 42B) can be a U-shaped gate dielectric contacting the semiconductor material of a body region (32A or 32B), a vertical sidewall of a raised source region (234A or 234B), a vertical sidewall of a raised drain region (234A' or 234B'), and vertical sidewalls of an inner dielectric gate spacer (56A or 56B). The U-shaped gate dielectrics include vertical portions, which have top surfaces that are coplanar with the top surfaces of the inner and outer dielectric gate spacers (56A, 58A, 56B, 58B) and the planarization dielectric layer 60. Each work function metal portion (44A, 46A, 46B) can be a U-shaped work function metal portion having top surfaces that are coplanar with the top surfaces of the inner and outer dielectric gate spacers (56A, 58A, 56B, 58B) and the planarization dielectric layer 60.

Thus, the materials of the disposable dielectric structure (25A, 27A, 25B, 27B) in the processing step of FIG. 12 is replaced with replacement gate structures, each of which includes a gate dielectric (42A or 42B) and a gate electrode, e.g., the first gate electrode (44A, 46A, 48A) or the second gate electrode (46B, 48B).

Each U-shaped gate dielectric, i.e., the first gate dielectric 42A and the second gate dielectric 42B, has a bottommost surface that is in contact with a portion of a topmost surface of the top semiconductor layer, i.e., the first body region 32A or the second body region 32B. Each inner dielectric gate spacer (56A, 56B) laterally contacts upper portions of outer sidewalls of a U-shaped gate dielectric. A work function metallic layer, i.e., the first work function metal layer 44A or the other second work function metal layer 46B, contacts inner surfaces of each U-shaped gate dielectric. Each gate conductor portion (48A, 48B) contacts inner surfaces of a work function metallic layer, i.e., the second work function metal layer 46A or the another second work function metal layer 46B.

A horizontal interface between the first raised source region 234A and the first inner and outer dielectric gate spacers (56A, 58A) is coplanar with a horizontal interface between the first raised drain region 234A' and the first inner and outer dielectric gate spacers (56A, 58A), and can be coplanar with a horizontal interface between the first gate dielectric 42A and the first body region 32A. A horizontal interface between the second raised source region 234B and the second inner and outer dielectric gate spacers (56B, 58B) is coplanar with a horizontal interface between the second raised drain region 234B' and the second inner and outer dielectric gate spacers (56B, 58B), and can be coplanar with a horizontal interface between the second gate dielectric 42B and the second body region 32B. Bottommost surfaces of the first inner and outer dielectric gate spacers (56A, 58A) are vertically spaced from the topmost surface of the top semiconductor layer 30 by a portion of the first raised source region 234A or a portion of the first raised drain region 234A'. Bottommost surfaces of the second inner and outer dielectric gate spacers (56B, 58B) are vertically spaced from the topmost surface of the top semiconductor layer 30 by a portion of the second raised source region 234B or a portion of the second raised drain region 234B'.

Figure 16:
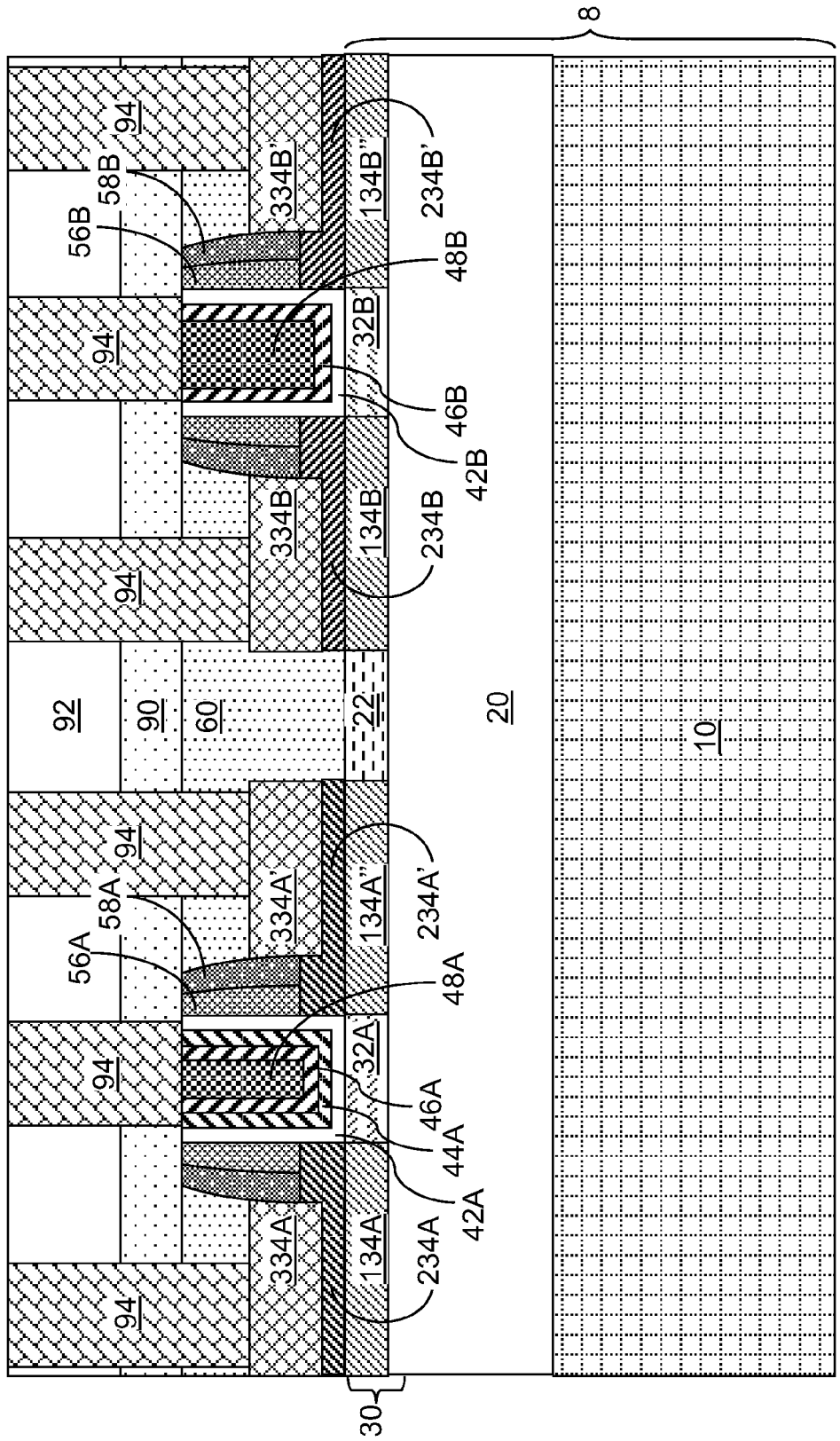
FIG. 16 is a vertical cross-sectional view of the first exemplary semiconductor structure after formation of at least one contact-level dielectric layer and formation of various contact via structures according to the first embodiment of the present disclosure.

Referring to FIG. 16, at least one contact-level dielectric layer (90, 92) and various contact structures 94 are formed. Each of the at least one contact-level dielectric layer (90, 92) includes a dielectric material such as silicon oxide, silicon nitride, and/or porous or non-porous organosilicate glass. The at least one contact-level dielectric layer (90, 92) can be deposited, for example, by chemical vapor deposition (CVD) or spin coating. The thickness of the at least one contact-level dielectric layer (90, 92) can be from 30 nm to 600 nm, although lesser and greater thicknesses can also be employed.

Various contact via holes are formed through the at least one contact-level dielectric layer (90, 92), for example, by applying and patterning a photoresist (not shown), and transferring the pattern in the photoresist into through the at least one contact-level dielectric layer (90, 92) and optionally through the planarization dielectric layer 60. The various contact via holes are filled with a conductive material to form various contact via structures, which can include at least one gate-contact via structure that contacts a gate electrode and at least one substrate-contact via structure that contacts a metal semiconductor alloy portion (334A, 334A', 334B, 334B') located on raised source and drain regions (234A, 234A', 234B, 234B').

Figure 17:
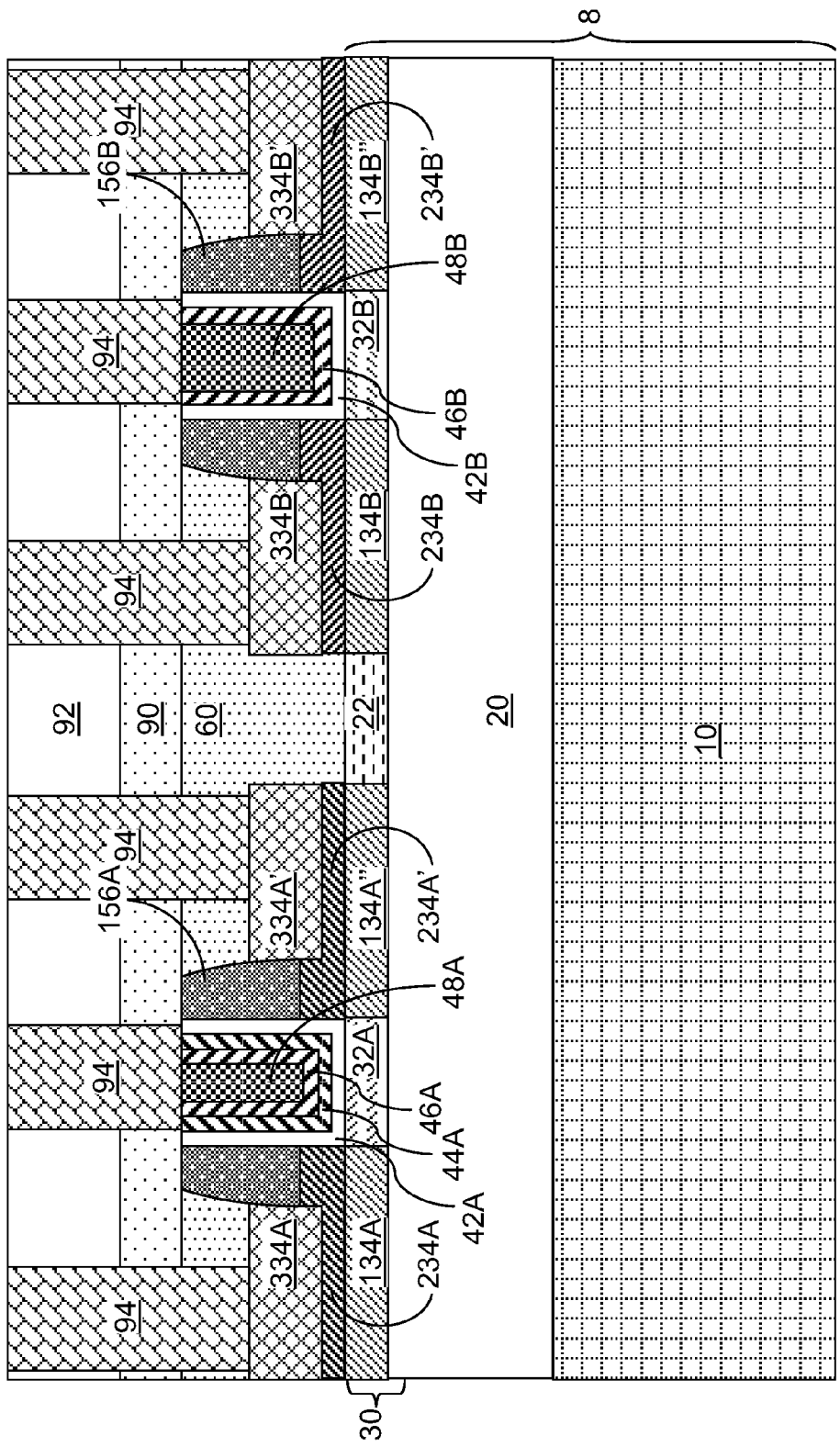
FIG. 17 is a vertical cross-sectional view of a second exemplary structure according to a second embodiment of the present disclosure.

Referring to FIG. 17, a second exemplary structure according to a second embodiment of the present disclosure can be derived by forming a first dielectric gate spacer 156A and a second dielectric gate spacer 156B in lieu of the combination of the first inner and outer dielectric gate spacers (56A, 58A) and the second inner and outer dielectric gate spacers (56B, 58B).

In one embodiment, the first dielectric gate spacer 156A and the second dielectric gate spacer 156B are formed at the processing step for forming the first inner dielectric gate spacer 56A and the second inner dielectric gate spacer 56B employing the same processing methods for forming the first inner dielectric gate spacer 56A and the second inner dielectric gate spacer 56B. The processing steps employed to form the first outer dielectric gate spacer 58A and the second outer dielectric gate spacer 58B, i.e., the processing steps of FIG. 9, are omitted in the second embodiment.

In another embodiment, the first dielectric gate spacer 156A and the second dielectric gate spacer 156B are formed at the processing step for forming the first outer dielectric gate spacer 58A and the second outer dielectric gate spacer 5BB employing the same processing methods for forming the first outer dielectric gate spacer 58A and the second outer dielectric gate spacer 58B. The processing steps employed to form the first inner dielectric gate spacer 56A and the second inner dielectric gate spacer 56B, i.e., the processing steps of FIG. 6, are omitted in the second embodiment. The ion implantation steps of FIGS. 7 and 8 employ the disposable dielectric structure (25A, 27A, 29A, 25B, 27B, 29B) as a part of an ion implantation mask.

The various semiconductor structures of the present disclosure enable thin channel ETSOI devices having low external resistance, i.e., low source and drain resistance. By aligning an edge of raised source and drain regions proximal to the body region to an edge of the body region, the resistance of the source region and the drain region can be reduced, and the control of the field effect transistor can be enhanced.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure, said method comprising:

forming a disposable dielectric structure on a top semiconductor layer of a semiconductor-on-insulator (SOI) substrate, wherein all physically exposed surfaces of said disposable dielectric structure are dielectric surfaces;

forming a stack of a planar source region and a raised source region and a stack of a planar drain region and a raised drain region, wherein a first interface between said planar source region and said first raised semiconductor material portion and a second interface between said planar drain region and said second raised semiconductor material portion are within a first plane including an interface between said disposable dielectric structure and said SOI substrate, wherein said raised source region and said raised drain region are formed by selective deposition of a first semiconductor material on a semiconductor surface of said top semiconductor layer of said SOI substrate, wherein said deposited first semiconductor material is in direct contact with a sidewall of said disposable dielectric structure;

forming, after formation of said raised source region and said raised drain region, at least one dielectric gate spacer around said disposable dielectric structure over, and directly on, top surfaces of said raised source region and said raised drain region, while physically exposing a surface portion of each of said raised source region and said raised drain region;

forming, after formation of said at least one dielectric gate spacers, elevated semiconductor material portions on said top surfaces of said raised source region and said raised drain region by selective depositing a second semiconductor material, wherein interfaces between said elevated semiconductor material portions and said raised source region and said raised drain region are formed within a second plane that includes a bottom surface of said at least one dielectric gate spacer;

forming metal semiconductor alloy portions by reacting a metal with said second semiconductor material and a portion of said first semiconductor material, wherein interfaces between said metal semiconductor alloy portions and remaining portions of said raised source region and said raised drain region are formed between said first plane and said second plane;

forming a planarization dielectric layer over said dielectric gate spacer;

physically exposing a top surface of said disposable dielectric structure by planarizing said planarization dielectric layer; and replacing materials of said disposable dielectric structure with a gate dielectric and a gate electrode.

2. The method of claim 1, wherein said dielectric gate spacer is not removed during replacement of said disposable dielectric structure.

3. The method of claim 1, wherein said raised source region and raised drain region are formed by selective epitaxy that deposits a single crystalline semiconductor material in epitaxial alignment with another single crystalline semiconductor material within said top semiconductor layer.

4. The method of claim 2, wherein said raised source region and raised drain region are deposited with in-situ doping of electrical dopants.

5. The method of claim 2, further comprising implanting electrical dopants into portions of said raised source region and said raised drain region employing said dielectric gate spacer as an implantation mask.

6. The method of claim 1, wherein said raised source region and raised drain region contact sidewalls of said disposable dielectric structure upon formation.

7. The method of claim 1, wherein said raised source region, said raised drain region, and said dielectric gate spacer contacts a dielectric material within said disposable dielectric structure, wherein said dielectric gate spacer comprises a different material than said dielectric material.

8. The method of claim 1, wherein said disposable dielectric structure consists of at least one dielectric material, and has vertical sidewalls that contiguously enclose said disposable dielectric structure laterally, and is in contact with a semiconductor surface of said top semiconductor layer.

9. The method of claim 1, wherein said elevated semiconductor material portions are formed as amorphous semiconductor material portions.

10. The method of claim 1, wherein said elevated semiconductor material portions are formed as polycrystalline semiconductor material portions.

11. The method of claim 1, wherein said elevated semiconductor material portions are formed as single crystalline semiconductor material portions.

12. The method of claim 1, wherein said planar source region and said planar drain region are formed by outdiffusion of dopants from said raised source region and from said raised drain region, respectively.

13. The method of claim 1, wherein said planar source region and said planar drain region are formed by implantation of electrical dopants into semiconductor material portions in said top semiconductor layer after formation of said raised source region and said raised drain region.

14. The method of claim 1, wherein said raised source region and said raised drain region are formed by in-situ doping of said first semiconductor material during deposition of said first semiconductor material.

15. The method of claim 1, wherein said raised source region and said raised drain region are formed by:
   forming intrinsic semiconductor material portions including said first semiconductor material on top surfaces of said top semiconductor layer by a selective epitaxy process; and
   implanting dopants into said intrinsic semiconductor material portions.

16. The method of claim 1, wherein said at least one dielectric gate spacer includes:
   an inner dielectric gate spacer formed directly on sidewalls of said disposable dielectric structure; and
   an outer dielectric gate spacer formed directly on sidewalls of said inner dielectric gate spacer.

17. The method of claim 1, wherein said second plane is coplanar with a bottom surface of said inner dielectric gate spacer and a bottom surface of said outer dielectric gate spacer.

* * * * *